(12) United States Patent
Takishita et al.

(10) Patent No.: US 11,043,528 B2
(45) Date of Patent: Jun. 22, 2021

(54) COMPOSITION, FORMED BODY, LAMINATE, FAR INFRARED RAY TRANSMITTING FILTER, SOLID-STATE IMAGING ELEMENT, INFRARED CAMERA, AND INFRARED SENSOR

(71) Applicant: FUJIFILM Corporation, Tokyo (JP)

(72) Inventors: Hirotaka Takishita, Haibara-gun (JP); Yoichi Hosoya, Haibara-gun (JP); Tokuju Oikawa, Haibara-gun (JP); Hidenori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 295 days.

(21) Appl. No.: 16/242,152

(22) Filed: Jan. 8, 2019

(65) Prior Publication Data

US 2019/0148451 A1 May 16, 2019

Related U.S. Application Data

(63) Continuation of application No. PCT/JP2017/030007, filed on Aug. 23, 2017.

(30) Foreign Application Priority Data

Sep. 21, 2016 (JP) .............................. JP2016-184022

(51) Int. Cl.
| | |
|---|---|
| *H01L 27/146* | (2006.01) |
| *G02B 1/04* | (2006.01) |
| *C09K 3/10* | (2006.01) |
| *G02B 5/24* | (2006.01) |
| *H04N 5/225* | (2006.01) |
| *G02B 5/22* | (2006.01) |

(52) U.S. Cl.
CPC .......... *H01L 27/14649* (2013.01); *C09K 3/10* (2013.01); *G02B 1/04* (2013.01); *G02B 1/041* (2013.01); *G02B 5/22* (2013.01); *G02B 5/24* (2013.01); *H01L 27/14623* (2013.01); *H04N 5/225* (2013.01); *C09K 2003/1075* (2013.01); *H04N 2005/2255* (2013.01)

(58) Field of Classification Search
CPC ........ H01L 27/14649; H01L 27/14623; C09K 3/10; C09K 2003/1075; G02B 1/04; G02B 1/041; G02B 5/22; G02B 5/24; H04N 5/225; H04N 2005/2255
See application file for complete search history.

(56) References Cited

U.S. PATENT DOCUMENTS

| | | | |
|---|---|---|---|
| 2001/0002275 A1 | 5/2001 | Oldenburg et al. | |
| 2008/0142075 A1* | 6/2008 | Reddy | ................... H01L 31/078 136/257 |
| 2010/0073764 A1* | 3/2010 | Kai | ........................ G02B 5/22 359/359 |
| 2015/0259547 A1* | 9/2015 | Ezoe | .................... C09D 201/00 257/432 |
| 2015/0260885 A1* | 9/2015 | Takishita | ............... G02B 5/223 250/338.1 |
| 2015/0260886 A1* | 9/2015 | Higuchi | .................... C08F 2/48 257/432 |
| 2015/0372037 A1 | 12/2015 | Tomeba | |
| 2016/0304730 A1 | 10/2016 | Hitomi et al. | |
| 2016/0380136 A1* | 12/2016 | Ning | ................... H01L 31/0368 252/519.4 |
| 2017/0254925 A1* | 9/2017 | Miura | ..................... B29C 48/08 |
| 2019/0351231 A1* | 11/2019 | Meyre | ..................... A61P 25/00 |

FOREIGN PATENT DOCUMENTS

| | | |
|---|---|---|
| JP | 2014-199925 A | 10/2014 |
| TW | 201443562 A | 11/2014 |
| WO | WO 2014/142259 A1 | 9/2014 |
| WO | WO 2015/111530 A1 | 7/2015 |

OTHER PUBLICATIONS

International Preliminary Report on Patentability and Written Opinion of the International Searching Authority for International Application No. PCT/JP2017/030007, dated Apr. 4, 2019, with English translation of the Written Opinion.
International Search Report for International Application No. PCT/JP2017/030007, dated Oct. 10, 2017, with English translation.
Taiwanese Office Action and Search Report, dated Dec. 17, 2020, for corresponding Taiwanese Application No. 106129414, with an English translation.

* cited by examiner

*Primary Examiner* — Blake C Riddick
(74) *Attorney, Agent, or Firm* — Birch, Stewart, Kolasch & Birch, LLP

(57) ABSTRACT

A composition includes a metal particle and a resin and has a wavelength band A having a wavelength band width of 1 μm or more in a wavelength range of 1 to 14 μm and a wavelength band B having a lower absorbance than the wavelength band A and having a wavelength band width of 1 μm or more, and a ratio $A_{min}/B_{max}$ between a minimum value $A_{min}$ of an absorbance of the wavelength band A and a maximum value $B_{max}$ of an absorbance of the wavelength band B is 3 or more.

21 Claims, No Drawings

COMPOSITION, FORMED BODY, LAMINATE, FAR INFRARED RAY TRANSMITTING FILTER, SOLID-STATE IMAGING ELEMENT, INFRARED CAMERA, AND INFRARED SENSOR

CROSS-REFERENCE TO RELATED APPLICATIONS

This application is a Continuation of PCT International Application No. PCT/JP2017/030007, filed on Aug. 23, 2017, which claims priority under 35 U.S.C. § 119(a) to Japanese Patent Application No. 2016-184022, filed on Sep. 21, 2016. Each of the above application(s) is hereby expressly incorporated by reference, in its entirety, into the present application.

BACKGROUND OF THE INVENTION

1. Field of the Invention

The present invention relates to a composition, a formed body, a laminate, a far infrared ray transmitting filter, a solid-state imaging element, an infrared camera, and an infrared sensor.

2. Description of the Related Art

In recent years, research on filters that selectively shield or transmit infrared rays has proceeded. As an example of the filter, a near infrared ray cut filter and the like are known.

For a video camera, a digital still camera, a mobile phone with a camera function or the like, a charge coupled device (CCD) or a complementary metal oxide semiconductor (CMOS) which is a solid-state imaging element of a color image is used. Since, in these solid-state imaging elements, silicon photodiodes sensitive to infrared rays are used at light receiving sections, visibility correction may be performed with a near infrared ray cut filter. JP2014-199925A discloses that a composition including cesium tungsten oxide is used so as to manufacture a near infrared ray cut filter having a transmittance of 60% or less in a wavelength range of 800 to 1300 nm.

SUMMARY OF THE INVENTION

In recent years, it has been researched to perform sensing with infrared rays having a longer wavelength (for example, light having a wavelength of 1 µm or more). Meanwhile, it is disclosed that the near infrared ray cut filter disclosed in JP2014-199925A shields at least a part of light in the wavelength range of 800 to 1,300 nm. However, the near infrared ray cut filter has high transmitting performance of light having a wavelength of greater than 1 µm and needs improvement in a case of being applied to the sensing application using light having a wavelength of 1 µm or more.

Accordingly, an object of the present invention is to provide a composition capable of manufacturing a formed body that selectively transmits light having a wavelength range of 1 to 14 µm. Another object of the present invention is to provide a formed body, a laminate, a far infrared ray transmitting filter, a solid-state imaging element, an infrared camera, and an infrared sensor in which the above composition is used.

According to the circumstances, the present inventors diligently conducted research to find that the object can be achieved by the following configurations, such that the present invention is completed. Accordingly, the present invention provides the following.

<1> A composition comprising: a metal particle; and a resin, in which the composition in a wavelength range of 1 to 14 µm has a wavelength band A having a wavelength band width of 1 µm or more, and a wavelength band B having a lower absorbance than the wavelength band A and having a wavelength band width of 1 µm or more, and a ratio $A_{min}/B_{max}$ between a minimum value $A_{min}$ of an absorbance of the wavelength band A and a maximum value $B_{max}$ of an absorbance of the wavelength band B is 3 or more.

<2> The composition according to <1>, in which the wavelength band B is on a longer wavelength side than the wavelength band A.

<3> The composition according to <1>, in which the wavelength band B is on a shorter wavelength side than the wavelength band A.

<4> The composition according to <1> or <2>, in which a ratio $A_{min}/B_{max}$ between the minimum value $A_{min}$ of the absorbance in a wavelength range of 1 to 3 µm and the maximum value $B_{max}$ of the absorbance in a wavelength range of 8 to 10 µm is 3 or more.

<5> The composition according to <1> or <2>, in which a ratio $A_{min}/B_{max}$ between the minimum value $A_{min}$ of the absorbance in a wavelength range of 3 to 5 µm and the maximum value $B_{max}$ of the absorbance in a wavelength range of 8 to 10 µm is 3 or more.

<6> The composition according to <1> or <2>, in which a ratio $A_{min}/B_{max}$ between the minimum value $A_{min}$ of the absorbance in a wavelength range of 8 to 10 µm and the maximum value $B_{max}$ of the absorbance in a wavelength range of 12 to 14 µm is 3 or more.

<7> The composition according to <1> or <3>, in which a ratio $A_{min}/B_{max}$ between the minimum value $A_{min}$ of the absorbance in a wavelength range of 12 to 14 µm and the maximum value $B_{max}$ of the absorbance in a wavelength range of 8 to 10 µm is 3 or more.

<8> The composition according to any one of <1> to <7>, in which a band gap energy of the metal particle at 25° C. is 1.0 eV or less.

<9> The composition according to any one of <1> to <8>, in which the metal particle includes at least one metal atom selected from the group consisting of Rh, W, Ta, Cr, Bi, Ag, Fe, Co, Mg, Mn, Ba, V, Pb, Ti, Sr, and Zr.

<10> A formed body obtained by using the composition according to any one of <1> to <9>.

<11> The formed body according to <10>, in which an average refractive index is 1.3 to 5.0 in a wavelength range of 8 to 14 µm.

<12> The formed body according to <10> or <11>, in which a shape of the formed body is a film shape, a flat sheet shape, or a lens shape.

<13> The formed body according to any one of <10> to <12>, which is used for a far infrared ray transmitting filter.

<14> A laminate comprising: a substrate; and the formed body according to any one of <10> to <13> provided on the substrate.

<15> The laminate according to <14>, in which a refractive index n1 of the formed body at a wavelength of 10 µm and a refractive index n2 of a layer that is in contact with the formed body in a thickness direction of the formed body at a wavelength of 10 µm satisfy the following relationship, $$(n2)^{0.5}-1 \leq n1 \leq (n2)^{0.5}+1.$$

<16> A far infrared ray transmitting filter comprising: the formed body according to any one of <10> to <13> or the laminate according to <14> or <15>.

<17> A solid-state imaging element comprising: the far infrared ray transmitting filter according to <16>.

<18> An infrared camera comprising: the far infrared ray transmitting filter according to <16>.

<19> An infrared sensor comprising: the far infrared ray transmitting filter according to <16>.

According to the present invention, it is possible to provide a composition with which a formed body that selectively transmits light having a wavelength range of 1 to 14 μm can be manufactured. As a result, it is possible to easily manufacture a formed body such as a far infrared ray transmitting filter by a coating process or the like, and thus heights of various sensors and the like can be reduced. In a case where the composition is caused to have photolithography performance, improvement of the function by forming a fine pattern becomes possible. It is possible to provide a formed body, a laminate, a far infrared ray transmitting filter, a solid-state imaging element, an infrared camera, and an infrared sensor in which the above composition is used.

DESCRIPTION OF THE PREFERRED EMBODIMENTS

Hereinafter, the content of the present invention is specifically described.

The following description of constituent elements may be made based on a representative embodiment of the present invention, but the present invention is not limited to the embodiment.

In the present specification, the numerical range expressed by using "to" means a range including numerical values described before and after "to" as a lower limit value and an upper limit value.

In the present specification, the "total solid content" refers to the total mass of components obtained by removing the solvent from all components of the composition.

With respect to an indication of a group (atomic group) in the present specification, an indication in which substitution or unsubstitution is not described includes a group (atomic group) having a substituent together with a group (atomic group) not having a substituent. For example, an "alkyl group" includes not only an alkyl group not having a substituent (unsubstituted alkyl group) but also an alkyl group having a substituent (substituted alkyl group).

In the present specification, "(meth)aryl" represents aryl and metharyl, "(meth)acrylate" represents acrylate and methacrylate, "(meth)acryl" represents acryl and methacryl, and "(meth)acryloyl" represents acryloyl and methacryloyl.

Unless described otherwise, the expression "exposure" in the present specification includes not only exposure using light but also drawing by particle beams such as electron beams or ion beams. Generally, examples of the light used for exposure include a bright line spectrum of a mercury lamp, far ultraviolet rays represented by excimer laser, actinic rays or radiation such as extreme ultraviolet rays (EUV light), X rays, or electron beams.

In the present specification, the "far infrared rays" means light (electromagnetic waves) having a wavelength of 0.7 to 1,000 μm.

In the present specification, the weight-average molecular weight and the number average molecular weight are defined as polystyrene equivalent values measured by gel permeation chromatography (GPC).

<Composition>

The composition according to the embodiment of the present invention is a composition including metal particles and a resin, the composition has a wavelength band A having a wavelength band width of 1 μm or more in a wavelength range of 1 to 14 μm and a wavelength band B having a lower absorbance than that of the wavelength band A in a wavelength band width of 1 μm or more, and a ratio $A_{min}/B_{max}$ between a minimum value $A_{min}$ of an absorbance of the wavelength band A and a maximum value $B_{max}$ of an absorbance of the wavelength band B is 3 or more.

With the composition according to the embodiment of the present invention, it is possible to manufacture a formed body that shields the light in a wavelength range of the wavelength band A and transmits the light in a wavelength range of the wavelength band B, and a formed body that selectively transmits having a specific wavelength in a wavelength range of 1 to 14 μm can be suitably manufactured. The formed body according to the embodiment of the present invention can be preferably used for a far infrared ray transmitting filter or the like. Since the wavelength band widths of the wavelength band A and the wavelength band B are 1 μm or more, respectively, it is possible to obtain a formed body having a wide wavelength band range of the light to be transmitted or shielded. Therefore, in a case where the formed body is used in an infrared camera, an infrared sensor, or the like, the difference between a signal and a noise can be increased, and the sensitivity of the sensor can be increased. Since the formed body can be manufactured by applying the composition according to the embodiment of the present invention to a substrate or a sensor on-chip or by using various forming methods such as injection, pressing, and extrusion of the composition according to the embodiment of the present invention, the formed body can be easily manufactured, and further a formed body can be manufactured with a low cost. The "far infrared ray transmitting filter" according to the embodiment of the present invention includes not only a filter that selectively transmits only far infrared rays in an optional wavelength but also a filter that selectively shields only far infrared rays in an optional wavelength.

The condition of the absorbance in the composition according to the embodiment of the present invention can be achieved by any means, but for example, as described below, the condition of the absorbance can be suitably achieved by causing the composition to contain metal particles and a resin and adjusting kinds and contents thereof. For example, in a case where metal particles having 1.0 eV or less of a band gap energy at 25° C. (more preferably 0.01 to 0.5 eV and more preferably 0.01 to 0.3 eV) are used as the metal particles, it is possible to obtain the composition satisfying the absorbance condition. Details of the metal particles are described below.

With respect to the spectral properties of the composition according to the embodiment of the present invention, the value of $A_{min}/B_{max}$ is preferably 3 or more, more preferably 4 or more, and even more preferably 5 or more. The upper limit may be, for example, 90 or less.

An absorbance $A\lambda$, at a certain wavelength $\lambda$ is defined by Expression (1).

$$A\lambda = -\log(T\lambda/100) \tag{1}$$

$A\lambda$ is an absorbance at the wavelength $\lambda$, and $T\lambda$ is a transmittance (%) at the wavelength $\lambda$.

According to the present invention, the value of the absorbance may be a value measured in a solution state and may be a value of a film (formed body) obtained by forming a film by using the composition. In a case where the absorbance is measured in a film state, the measurement is preferably performed by using a film manufactured by coating a substrate such as a glass substrate with the composition by a method of spin coating or the like such that a thickness of a film after drying becomes a predetermined thickness, and drying the composition at 100° C. for 120 seconds by using a hot plate. The thickness of the film can be measured with a probe type surface profile measuring device (DEKTAK150 manufactured by ULVAC Inc.) for a substrate having the film.

The absorbance can also be measured with a conventionally known spectrophotometer. The measurement condition of the absorbance is not particularly limited, but it is preferable to measure the maximum value $B_{max}$ of the absorbance in the wavelength band B in a condition adjusted such that the minimum value $A_{min}$ of the absorbance in the wavelength band A becomes 0.1 to 3.0. Measurement error can be reduced by measuring the absorbance under such conditions. A method of adjusting the minimum value $A_{min}$ of the absorbance in the wavelength band A to be 0.1 to 3.0 is not particularly limited. For example, in a case where the absorbance is measured in the composition state, examples thereof include a method of adjusting an optical path length of a sample cell. In a case where the absorbance is measured in a film state, examples thereof include a method of adjusting a film thickness.

The composition according to the embodiment of the present invention preferably has the wavelength band B on a longer wavelength side or a shorter wavelength side than the wavelength band A.

With respect to the composition according to the embodiment of the present invention, a ratio $A_{min}/A_{max}$ between the minimum value $A_{min}$ and a maximum value $A_{max}$ of the absorbance in the wavelength band A is preferably 0.1 to 1.0, more preferably 0.3 to 1.0, and even more preferably 0.5 to 1.0. The ratio $B_{min}/B_{max}$ between a minimum value $B_{min}$ and the maximum value $B_{max}$ of the absorbance in the wavelength band B is preferably 0.001 to 1.0, more preferably 0.01 to 1.0, and even more preferably 0.02 to 1.0.

Examples of the preferable aspects of the composition include (1) to (4) below.

(1) A composition in an aspect in which a ratio $A_{min}/B_{max}$ between the minimum value $A_{min}$ of the absorbance in a wavelength range of 1 to 3 μm and the maximum value $B_{max}$ of the absorbance in the wavelength range of 8 to 10 μm is 3 or more.

(2) A composition in an aspect in which a ratio $A_{min}/B_{max}$ between the minimum value $A_{min}$ of the absorbance in the wavelength range of 3 to 5 μm and the maximum value $B_{max}$ of the absorbance in the wavelength range of 8 to 10 μm is 3 or more.

(3) A composition in an aspect in which a ratio $A_{min}/B_{max}$ between the minimum value $A_{min}$ of the absorbance in a wavelength range of 8 to 10 μm and the maximum value $B_{max}$ of the absorbance of the wavelength range of 12 to 14 μm is 3 or more.

(4) A composition in an aspect in which a ratio $A_{min}/B_{max}$ between the minimum value $A_{min}$ of the absorbance in the wavelength range of 12 to 14 μm and the maximum value $B_{max}$ of the absorbance of the wavelength range of 8 to 10 μm is 3 or more.

With the composition according to the aspect (1), it is possible to manufacture a formed body that shields light at a wavelength of 1 to 3 μm and transmits light at a wavelength of 8 to 10 μm. This formed body can be preferably used, for example, in the sensing in which light at a wavelength of 8.9 to 9.9 μm is used.

With the composition according to the aspect (2), it is possible to manufacture a formed body that shields light at a wavelength of 3 to 5 μm and transmits light at a wavelength of 8 to 10 μm. This formed body can be preferably used, for example, for the sensing in which light at a wavelength of 8.9 to 9.9 μm is used.

With the composition according to the aspect (3), it is possible to manufacture a formed body that shields light at a wavelength of 8 to 10 μm and transmits light at a wavelength of 12 to 14 μm. This formed body can be preferably used, for example, for the sensing in which light at a wavelength of 12.5 to 13.5 μm is used.

With the composition according to the aspect (4), it is possible to manufacture a formed body that shields light at a wavelength of 12 to 14 μm and transmits light at a wavelength of 8 to 10 μm. This formed body can be preferably used, for example, for the sensing in which light at a wavelength of 8.9 to 9.9 μm is used.

Hereinafter, the respective components of the composition according to the embodiment of the present invention are specifically described.

<<Metal Particles>>

The Composition According to the Embodiment of the Present Invention Generally contains metal particles. As the metal particles, metal particles having a band gap energy of 1.0 eV or less (more preferably 0.01 to 0.5 eV and even more preferably 0.01 to 0.3 eV) at 25° C. can be preferably used.

The band gap energy of the metal particle can be measured by measuring the absorbance of the metal particles with a spectrophotometer. Specifically, the band gap energy of the metal particles can be measured by the following method.

The absorbance of metal particles in a wavelength range of 400 to 2,500 nm was measured with an ultraviolet-visible near-infrared spectrophotometer U-4150 (manufactured by Hitachi High-Technologies Corporation), and the absorbance of the metal particles in the wavelength range of 2.5 μm to 25 μm was measured with NICOLET6700FT-IR (manufactured by Thermo Fisher Scientific Inc.). The absorbance measured by the above method is plotted on a graph in which a vertical axis is $(ahv)^{0.5}$ and a lateral axis is an energy value (eV), and is converted into a $(ahv)^{0.5}$-eV curve. Here, the $(ahv)^{0.5}$-eV curve is a graph in which a vertical axis is $(ahv)^{0.5}$, and the lateral axis is an energy value (eV). a is an absorbance, h is Planck constant, and v is a frequency.

The energy value $E^1$ at a certain wavelength $\lambda^1$ has the following relationship. The wavelength can be converted into an energy value from the following relational expression.

$$E^1 = 1240/\lambda^1$$

The unit of $E^1$ is eV, and the unit of $\lambda^1$ is nm.

In the above $(ahv)^{0.5}$-eV curve, an energy value at the intersection of the tangent of a portion in which the value of $(ahv)^{0.5}$ rises and the tangent of a portion before the value of $(ahv)^{0.5}$ rises is calculated, and the energy value at the intersection is set as a band gap energy.

With respect to the metal particle of the present invention, the refractive index at the wavelength of 10 μm is preferably 1.3 to 5.0. The lower limit of the refractive index at a wavelength of 10 μm is preferably 1.35 or more and more preferably 1.4 or more. The upper limit is preferably 4.5 or less and more preferably 4.0 or less. According to the present invention, as the refractive index of the metal particle, a well-known number is used with respect to a material of which the number of bulk crystals is known, and a value obtained by forming a vapor deposition film of a compound constituting a measurement target metal particle and manufactured by IR-VASE manufactured by J. A. Woollam Co. is used with respect to a material of which the number of bulk crystals is not known.

An average primary particle diameter of the metal particle is preferably 100 nm or less and more preferably 50 nm or less. The lower limit can be, for example, 1 nm or more and can be 10 nm or more. In a case where the average primary particle diameter of the metal particle is 100 nm or less, it is possible to expect an effect in which scattering of infrared rays is suppressed and the transmittance is increased. According to the present invention, as the average primary particle diameter of the metal particle, a number average diameter of the primary particles of the metal particles calculated from the particle size distribution of the primary particle diameters of the metal particles is used. A primary particle diameter of the metal particle can be obtained by observing the metal particle with a transmission electron microscope (TEM) and measuring a portion where the metal particles are not aggregated. The particle size distribution of the primary particles of the metal particles can be obtained by imaging the primary particles of the metal particles with a transmission electron microscope and then processing the images with an image processing device. As the transmission electron microscope, an electron microscope (H-7000) manufactured by Hitachi, Ltd. can be used. As the image processing device, LUZEX AP manufactured by Nireco Corporation can be used.

As the metal particles, particles of a metal compound can be used. Examples of the metal compound include metal oxide, metal silicide, a titanate compound, a zirconate compound, a zirconate titanate compound, a metal phosphate compound, a metal fluorinated compound, and metal chalcogenide.

Examples of the metal oxide include iron oxide ($Fe_2O_3$, $Fe_3O_4$, FeO, $BaFe_{12}O_{19}$, $SrFe_{12}O_{19}$, $NiFe_2O_4$ (M=Ni, Co, Mn, Cu, Zn, Ca, or the like)), aluminum oxide ($Al_2O_3$ or the like), cobalt oxide (CoO, $Co_2O_3$), titanium oxide ($Ti_2O_3$, $Ti_3O_5$, or the like), vanadium oxide ($V_2O_3$, $V_2O_4$, or $V_2O_5$), manganese oxide (MnO, $MnO_2$), tantalum oxide ($Ta_2O_5$), tungsten oxide ($WO_3$), cerium oxide ($CeO_2$), and rhodium oxide ($Rh_2O_3$).

Examples of the metal silicide include the following.
(1) $M_2Si$ (M=Mg, Ca, Ti, V, Cr, Mn, Fe, Co, Ni, Pd, Pt, or the like)
(2) MSi (M=K, Rb, Cs, Ca, Ce, Cr, Mn, Fe, Co, Ni, Ru, Pd, or the like)
(3) $MSi_2$ (M=Ca, Sr, Ba, Ce, Ti, Zr, Th, V, Nb, Ta, Mo, W, U, Pu, Mn, Re, Fe, Co, Ni, or the like)

The metal silicide may be a single compound or may be a mixed crystal in which a plurality of M's are present.

Examples of the titanate compound include $MTiO_3$ (M=Mg, Ca, Sr, Ba, Pb, Ra, Cu, Zn, or the like), $Ce(TiO_3)_2$, and $Bi(TiO_3)_3$. The titanic acid compound may be a single compound or may be a mixed crystal in which a plurality of M's are present.

Examples of the zirconic acid compound include $Li_2ZrO_3$, and $MZrO_3$ (M=Mg, Ca, Sr, Ba, Pb, Ra, or the like). The zirconic acid compound may be a single compound or may be a mixed crystal in which a plurality of M's are present.

Examples of the zirconium titanate compound include lead zirconate titanate and barium zirconate titanate.

Examples of the metal phosphate compound include a compound of phosphoric acid and a transition metal element. Examples thereof include $Ag_3PO_4$, $AlPO_4$, $SbPO_4$, $BiPO_4$, $Hg_3PO_4$, and $YbSO_4$.

Examples of the metal fluorinated compound include LiF, NaF, $MgF_2$, $SrF_2$, $BaF_2$, $VF_3$, $VF_4$, $CrF_3$, and $BiF_3$.

Examples of the metal chalcogenide include a compound of a transition metal element and a chalcogen element (S, Se, or Te). Examples thereof include $Ag_2S$, $Ag_2Se$, $Ag_2Te$, $Cu_2S$, CuS, $Cu_2Se$, CuSe, $Cu_2Te$, CuTe, ZnS, ZnSe, ZnTe, and PbS.

According to the present invention, a metal particle including at least one metal atom selected from the group consisting of Rh, W, Ta, Cr, Bi, Ag, Fe, Co, Mg, Mn, Ba, V, Pb, Ti, Sr, and Zr can be preferably used as the metal particles.

Specific examples of the metal particles that can be preferably in the present invention include the followings. Examples thereof include $Rh_2O_3$ particles, $Ag_2S$ particles, $FeSi_2$ particles, CoO particles, $Mg_2Si$ particles, MnSi particles, $MnO_2$ particles, $BaSi_2$ particles, $V_2O_3$ particles, PbS particles, $Ag_2Te$ particles, $Ti_2O_3$ particles, $SrZrO_3$ particles, $BaZrO_3$ particles, $Ta_2O_5$ particles, $WO_3$ particles, $CrF_3$ particles, $BiF_3$ particles, $Li_2ZrO_3$ particles, $CaZrO_3$ particles, $CuTiO_3$ particles, $ZnTiO_3$ particles, $Ce(TiO_3)_2$ particles, $Bi(TiO_3)_3$ particles, $CaTiO_3$ particles, $BaTiO_3$ particles, particles including a mixed crystal of $Ag_2S$ and $Ag_2Te$, particles including a mixed crystal of CoO and $MnO_2$, particles including a mixed crystal of $Ti_2O_3$ and $V_2O_3$, and particles including a mixed crystal of $Mg_2Si$ and $BaSi_2$.

Among the metal particles, for example, one or more selected from $Rh_2O_3$ particles, $Ag_2S$ particles, $FeSi_2$ particles, $Mg_2Si$ particles, MnSi particles, $MnO_2$ particles, $Ag_2Te$ particles, $CrF_3$ particles, $BiF_3$ particles, $Li_2ZrO_3$ particles, $CaZrO_3$ particles, $CuTiO_3$ particles, $ZnTiO_3$ particles, $Ce(TiO_3)_2$ particles, $Bi(TiO_3)_3$ particles, $CaTiO_3$ particles, $BaTiO_3$ particles, and particles including a mixed crystal of $Mg_2Si$ and $BaSi_2$ are used, so as to obtain a composition having the spectral properties of (1).

Among the metal particles, for example, one or more selected from $BaSi_2$ particles, $V_2O_3$ particles, PbS particles, particles including a mixed crystal of $Ag_2S$ and $Ag_2Te$, particles including a mixed crystal of CoO and $MnO_2$, particles including a mixed crystal of $Ti_2O_3$ and $V_2O_3$, and particles including a mixed crystal of $BaSi_2$ and $BaZrO_3$ are used, so as to obtain a composition having the spectral properties of (2).

Among the metal particles, for example, one or more selected from CoO particles and $Ti_2O_3$ particles are used, so as to obtain a composition having the spectral properties of (3).

Among the metal particles, for example, one or more selected from $Ta_2O_5$ particles, $WO_3$ particles, $SrZrO_3$ particles, and $BaZrO_3$ particles are used, so as to obtain a composition having the spectral properties of (4).

The shape of the metal particle is not particularly limited and examples thereof may include an isotropic shape (for example, a spherical shape and a polyhedral shape), an anisotropic shape (for example, a needle shape, a rod shape, and a plate shape), and an irregular shape.

The metal particles may be particles surface-treated with a surface treatment agent. Examples of the surface treatment agent include polyol, aluminum oxide, aluminum hydroxide, silica (silicon oxide), hydrous silica, alkanolamine, stearic acid, organosiloxane, zirconium oxide, hydrogen dimethicone, a silane coupling agent, and a titanate coupling agent.

In the surface treatment, the surface treatment agent may be used singly, or two or more kinds of surface treatment agents may be used in combination.

The content of the metal particles is preferably 1 to 99 mass % with respect to the total solid content of the composition. The lower limit is preferably 10 mass % or more, more preferably 20 mass % or more, even more preferably 30 mass % or more, and particularly preferably 40 mass % or more. The upper limit thereof is preferably 95 mass % or less, more preferably 90 mass % or less, even more preferably 85 mass % or less, and particularly preferably 80 mass % or less.

<<Resin>>

The composition according to the embodiment of the present invention includes a resin. For example, the resin is formulated, for example, for the application in which the various particles such as metal particles are dispersed in the composition and for the application of the binder. The resin used for mainly dispersing the metal particles or the like in the composition is referred to as dispersing agent. These applications of the resin are provided as examples, and a resin can be used for the purpose other than these applications.

The weight-average molecular weight (Mw) of the resin is preferably 2,000 to 2,000,000. The upper limit is preferably 1,000,000 or less and more preferably 500,000 or less. The lower limit is preferably 3,000 or more and more preferably 5,000 or more.

The content of the resin is preferably 0.1 to 80 mass % with respect to the total solid content of the composition. The lower limit is preferably 0.5 mass % or more and more preferably 1 mass % or more. The upper limit is preferably 70 mass % or less and more preferably 60 mass % or less. The resin may be included singly, or two or more kinds thereof may be included. In a case where two or more kinds of the resins are contained, the total amount thereof is preferably in the above range.

(Binder)

The composition according to the embodiment of the present invention preferably contains a resin as a binder. Examples of the binder include a (meth)acrylic resin, a (meth)acrylamide resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, and a siloxane resin. These resins may be used singly or two or more kinds thereof may be used in combination. In view of improving heat resistance, a norbornene resin can be preferably used as the cyclic olefin resin. Examples of a commercially available product of the norbornene resin include ARTON series (for example, ARTON F 4520) manufactured by JSR Corporation.

As the resin, a resin having an acid group can also be used. Examples of the acid group include a carboxyl group, a phosphoric acid group, a sulfo group, and a phenolic hydroxy group. These acid groups may be used singly or two or more kinds thereof may be used in combination. The resin having an acid group can also be used as an alkali-soluble resin. The resin having an acid group can also be used as a dispersing agent.

A weight-average molecular weight (Mw) of a resin having an acid group is preferably 5,000 to 200,000. The upper limit is preferably 100,000 or less and more preferably 20,000 or less. The number average molecular weight (Mn) is preferably 1,000 to 20,000.

The acid value of the resin having an acid group is preferably 30 to 500 mg KOH/g. The lower limit is more preferably 50 mgKOH/g or more and even more preferably 70 mgKOH/g or more. The upper limit is more preferably 400 mgKOH/g or less, even more preferably 200 mgKOH/g or less, particularly preferably 150 mgKOH/g or less, and most preferably 120 mgKOH/g or less.

The resin having an acid group is preferably a polymer having a carboxyl group at a side chain. Specific examples thereof include an alkali-soluble phenolic resin such as a methacrylic acid copolymer, an acrylic acid copolymer, an itaconic acid copolymer, a crotonic acid copolymer, a maleic acid copolymer, a partially esterified maleic acid copolymer, and a novolak-based resin, an acidic cellulose derivative having a carboxyl group in a side chain, and a resin obtained by adding an acid anhydride to a polymer having a hydroxy group. Particularly, a copolymer of (meth)acrylic acid and another monomer copolymerizable with this is preferable as an alkali-soluble resin. Examples of the other monomer copolymerizable with (meth)acrylic acid include alkyl (meth)acrylate, aryl (meth)acrylate, and a vinyl compound. Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, and cyclohexyl (meth)acrylate, and examples of the vinyl compound include styrene, α-methylstyrene, vinyl toluene, glycidyl methacrylate, acrylonitrile, vinyl acetate, N-vinyl pyrrolidone, tetrahydrofurfuryl methacrylate, a polystyrene macromonomer, and a polymethyl methacrylate macromonomer. As other monomers, N-phenylmaleimide, N-cyclohexylmaleimide, and the like, for example, an N-substituted maleimide monomer disclosed in JP1998-300922A (JP-H10-300922A) can also be used. These monomers copolymerizable with (meth)acrylic acid may be used singly or two or more kinds thereof may be used in combination.

The resin having an acid group, a benzyl (meth)acrylate/ (meth)acrylic acid copolymer, a benzyl (meth)acrylate/ (meth) acrylic acid/2-hydroxyethyl (meth)acrylate copolymer, and a multi-copolymer consisting of a benzyl (meth) acrylate/(meth)acrylic acid/other monomer can also be preferably used. A resin obtained by copolymerizing 2-hydroxyethyl (meth) acrylate, a 2-hydroxypropyl (meth) acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer disclosed in JP1995-140654A (JP-H7-140654A) can be preferably used.

It is also preferable that the resin having an acid group includes a polymer obtained by polymerizing a monomer component including a compound represented by Formula (ED1) and/or a compound (hereinafter, also referred to as an "ether dimer") represented by Formula (ED2).

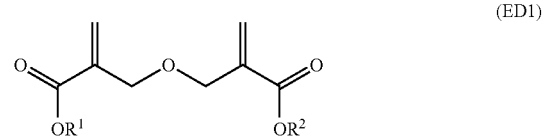

(ED1)

In Formula (ED1), $R^1$ and $R^2$ each independently represent a hydrogen atom or a hydrocarbon group having 1 to 25 carbon atoms which may have a substituent.

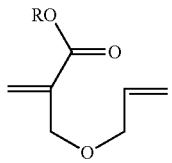
(ED2)

In Formula (ED2), R represents a hydrogen atom or an organic group having 1 to 30 carbon atoms. As specific example of Formula (ED2), the description of JP2010-168539A can be referred to.

As a specific example of the ether dimer, for example, paragraph 0317 of JP2013-029760A can be referred to, and the content thereof is incorporated into the present specification. The ether dimer may be used singly or two or more kinds thereof may be used in combination.

The resin having an acid group may include a repeating unit derived from a compound represented by Formula (X).

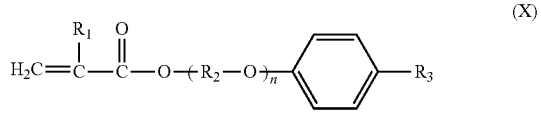
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may contain a benzene ring. n represents an integer of 1 to 15.

As the resin having an acid group, the description of paragraphs 0558 to 0571 (corresponding to paragraph 0685 to 0700 of US2012/0235099A) of JP2012-208494A and the description in paragraphs 0076 to 0099 of 2012-198408 can be referred to, and the contents thereof are incorporated into the present specification. Specific examples of the resin having an acid group include the following resins.

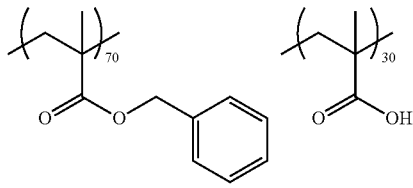

The resin may have a curable group. Examples of the curable group include a group having an ethylenically unsaturated bond, an epoxy group, a methylol group, and an alkoxysilyl group. Examples of the group having an ethylenically unsaturated bond include a vinyl group, a (meth) allyl group, a (meth)acryloyl group, and a (meth)acryloyloxy group. Examples of the alkoxysilyl group include a monoalkoxysilyl group, a dialkoxysilyl group, and a trialkoxysilyl group. The resin having a curable group is also a curable compound.

Examples of the resins containing a curable group include DIANAL NR series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (all manufactured by Osaka Organic Chemical Industry Ltd.), CYCLOMER P series (for example, ACA230AA), PLACCEL CF 200 series (all manufactured by Daicel Corporation), EBECRYL 3800 (manufactured by Daicel UCB Co., Ltd.), and ACRICURE RD-F8 (manufactured by Nippon Shokubai Co., Ltd.).

According to the present invention, as the resin, MAR-PROOF G-0150M, G-0105SA, G-0130SP, G-0250SP, G-10055, G-1005SA, G-1010S, G-2050M, G-01100, and G-01758 (manufactured by NOF Corporation, epoxy group-containing polymer), and ARTON F4520 (manufactured by JSR Corporation), are also preferably used.

The content of the binder is preferably 0.1 to 80 mass % with respect to the total solid content of the composition. The lower limit is preferably 0.01 mass % or more and more preferably 1 mass % or more. The upper limit is preferably 80 mass % or less and more preferably 70 mass % or less. The binders may be contained singly or two or more kinds thereof may be contained in combination. In a case where two or more kinds are included, it is preferable that the total amount thereof is in the above range.

(Dispersing Agent)

The composition according to the embodiment of the present invention preferably contains a resin as a dispersing agent. Examples of the dispersing agent include polymer dispersing agents [for example, a resin having an amine group (polyamidoamine and a salt thereof), an oligoimine-based resin, polycarboxylic acid and a salt thereof, high molecular weight unsaturated acid ester, modified polyurethane, modified polyester, modified poly(meth)acrylate, a (meth)acrylic copolymer, and a naphthalene sulfonic acid formalin polycondensate]. From the structure thereof, the polymer dispersing agent can be classified into a linear polymer, a terminal-modified polymer, a graft-type polymer, and a block-type polymer.

It is preferable that the dispersing agent is a resin having a region having adsorption ability to metal particles (hereinafter collectively referred to as an "adsorption site"). Examples of the adsorption site include a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxyl group. The adsorption site is preferably an acid-based adsorption site. Examples of the acid-based adsorption site include an acid group. Among these, it is preferable that the acid-based adsorption site is at least one of a phosphorus atom-containing group or a carboxyl group. Examples of the phosphorus atom-containing group include a phosphoric acid ester group, a polyphosphoric acid ester group, and a phosphoric acid group. With respect to the details of the adsorption site, paragraphs 0073 to 0080 of JP2015-034961A can be referred to, and the contents thereof are incorporated into the present specification.

According to the present invention, the resin (dispersing agent) is preferably a resin represented by Formula (111).

$$(A^1 - R^2 )_n\, R^1 - (P^1)_m$$
(111)

In Formula (111), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxyl group. n $A^1$'s and $R^2$'s are identical to or different from each other. m represents a positive number of 8 or less, n represents 1 to 9, and m+n is 3 to 10. $P^1$ represents a monovalent polymer chain. m $P^1$'s may be identical to or different from each other.

In the resin represented by the formula (111), since the monovalent substituent $A^1$ can interact with the metal particles, by causing the resin to have n monovalent substituents $A^1$, the resin firmly interacts with the metal particles so as to improve the dispersibility of the metal particles in the composition. Since a monovalent polymer chain $P^1$ functions as a steric repulsive group, by causing the resin to have m monovalent polymer chains $P^1$, the resin exhibits a good steric repulsive force such that the metal particles can be evenly dispersed in the composition.

In Formula (111), $R^1$ represents (m+n)-valent linking group. Examples of the (m+n)-valent linking group include a linking group having 1 to 100 carbon atoms, 0 to 10 nitrogen atoms, 0 to 50 oxygen atoms, 1 to 200 hydrogen atoms, and 0 to 20 sulfur atoms. For details of the (m+n)-valent linking group, paragraph 0076 to 0084 of JP2007-277514A can be referred to, and the contents thereof are incorporated into the present specification.

In Formula (111), $P^1$ represents a monovalent polymer chain. The monovalent polymer chain is preferably a monovalent polymer chain having a repeating unit derived from a vinyl compound. With respect to the details of the polymer chain, paragraphs 0087 to 0098 of JP2007-277514A can be referred to, and the contents thereof are incorporated into the present specification.

In Formula (111), $R^2$ represents a single bond or a divalent linking group. Examples of the divalent linking group include a linking group having 1 to 100 carbon atoms, 0 to 10 nitrogen atoms, 0 to 50 oxygen atoms, 1 to 200 hydrogen atoms, and 0 to 20 sulfur atoms, and the divalent linking group may be unsubstituted or may further have a substituent. Details of the divalent linking group include paragraphs 0071 to 0075 of JP2007-277514A, and the contents thereof are incorporated into the present specification.

With respect to the details of the monovalent substituent represented by $A^1$ in Formula (111), paragraphs 0041 to 0070 of JP2007-277514A may be referred to and the contents thereof are incorporated into the present specification.

As the resin represented by Formula (111), paragraph 0039 of JP2007-277514A (corresponding to paragraph 0053 of US2010/0233595A), paragraphs 0081 to 0117 of JP2015-034961A, JP5909468B, JP5894943B, and JP5894944B can be referred to, and the contents thereof are incorporated into the present specification. Specific examples of the resin represented by Formula (111) include the following resins.

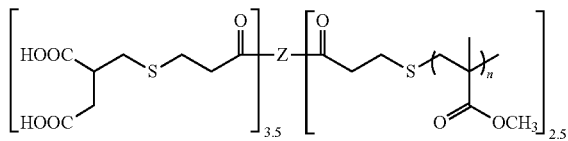

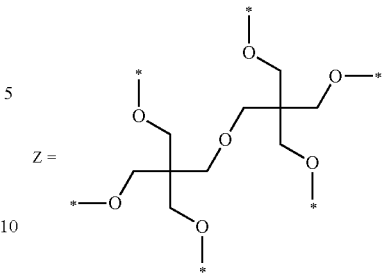

In the present invention, as the resin (dispersing agent), a graft copolymer including a repeating unit represented by any one of Formulae (11) to (14) may be used.

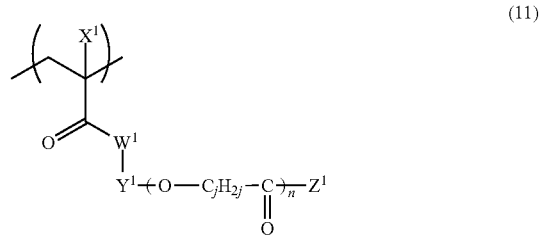

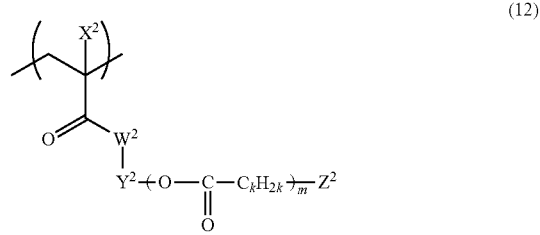

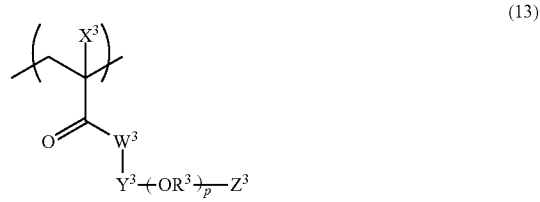

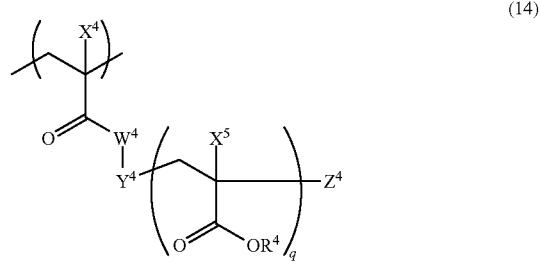

In Formulae (11) to (14), $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p is 2 to 500, the plurality of $R^3$'s may be identical to or different from each other, and, in Formula (14), in a case where q is 2 to 500, the plurality of $X^5$'s and $R^4$'s may be identical to or different from each other.

With respect to the graft copolymer, the description of paragraphs 0025 to 0094 of JP2012-255128A is referred to, and the contents thereof are incorporated in the present specification. Specific examples of the graft copolymer include the following resins. Examples thereof include resins disclosed in paragraphs 0072 to 0094 of JP2012-255128A, and the contents thereof are incorporated in the present specification.

functional group having pKa of 12 or less is preferable, and a functional group having a pKa of 11 or less is most preferable.

The oligoimine-based dispersing agent is preferably a resin having a repeating unit containing a basic nitrogen atom to which a partial structure X having a functional group having pKa of 14 or less is bonded and the oligomer chain or polymer chain Y having atoms of 40 to 10,000 in a side chain.

In view of dispersibility, dispersion stability, and developability, the number of atoms of the oligomer chain or polymer chain Y is preferably 50 to 5,000 and more preferably 60 to 3,000. The number average molecular weight of Y can be measured by a value in terms of polystyrene by the GPC method. The number average molecular weight of Y is preferably 1,000 to 50,000 and more preferably 1,000 to 30,000.

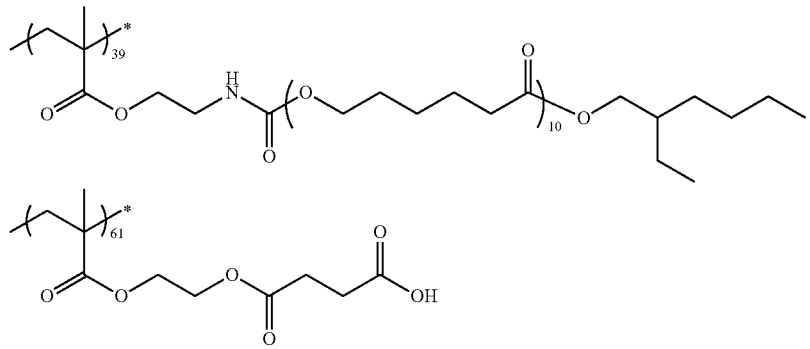

According to the present invention, the resin (dispersing agent) is also preferably an oligoimine-based dispersing agent including a basic nitrogen atom in at least one of the main chain or the side chain. As the oligoimine-based dispersing agent, a resin having a side chain including a repeating unit having a partial structure X having a functional group having pKa of 14 or less and an oligomer chain or a polymer chain Y having atoms of 40 to 10,000 and having basic nitrogen atoms in a main chain and at least one side chain is preferable. Since this resin interacts with metal particles on both sides of a nitrogen atom and the functional group of pKa of 14 or less which is included by a structure X, and the resin has an oligomer chain or polymer chain Y having 40 to 10,000 atoms, the oligomer chain or polymer chain Y functions as a steric repulsive group, such that satisfactory dispersibility is exhibited, and metal particles can be uniformly dispersed. The sedimentation of the metal particles can be suppressed for a long period of time by interaction between the oligomer chain or polymer chain Y and the solvent. Since the oligomer chain or the polymer chain Y functions as a steric repulsive group, aggregation of the metal particles is prevented, so even in a case where the content of the metal particles is increased, excellent dispersibility can be obtained.

Here, the "basic nitrogen atom" is not particularly limited, as long as the basic nitrogen atom is a basic nitrogen atom, and the resin preferably contains a structure having a nitrogen atom having pKb of 14 or less, and more preferably contains a structure having a nitrogen atom having pKb of 10 or less. "pKb (base strength)" according to the present invention refers to pKb at a water temperature of 25° C. and is one of the indexes for quantitatively expressing the base strength, and the basicity constant is also the same. The base strength pKb and the acid strength pKa have a relationship of pKb=14−pKa.

The functional group having pKa of 14 or less included in the partial structure X is not particularly limited, and the structure and the like are not particularly limited as long as the physical properties satisfy this condition. Particularly, a Examples of the oligoimine-based dispersing agent include a resin including at least one of a repeating unit represented by Formula (I-1), a repeating unit represented by Formula (I-2), or a repeating unit represented by Formula (I-2a) and the like.

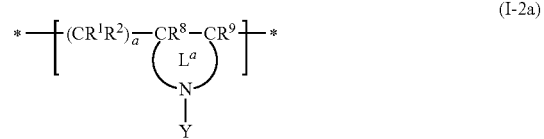

$R^1$ and $R^2$ each independently represent a hydrogen atom, a halogen atom, or an alkyl group (preferably having 1 to 6 carbon atoms).

a's each independently represent an integer of 1 to 5. * represents a linking site between repeating units.

$R^8$ and $R^9$ are groups which are the same as $R^1$.

L is a single bond, an alkylene group (preferably having 1 to 6 carbon atoms), an alkenylene group (preferably having 2 to 6 carbon atoms), an arylene group (preferably having 6 to 24 carbon atoms), a heteroarylene group (preferably having 1 to 6 carbon atoms), an imino group (preferably having 0 to 6 carbon atoms), an ether group, a thioether group, a carbonyl group, or a linking group relating to a combination thereof. Among these, a single bond or —$CR^5R^6$—$NR^7$— (the imino group becomes any one of X or Y) is preferable. Here, $R^5$ and $R^6$ each independently represent a hydrogen atom, a halogen atom, and an alkyl group (preferably having 1 to 6 carbon atoms). $R^7$ a hydrogen atom or an alkyl group having 1 to 6 carbon atoms.

$L^a$ is a structural moiety that forms a ring structure together with $CR^8CR^9$ and N and is preferably a structural moiety that forms a nonaromatic heterocyclic ring having 3 to 7 carbon atoms together with the carbon atoms of $CR^8CR^9$. A structural moiety that forms a 5- to 7-membered nonaromatic heterocyclic ring in combination with carbon atoms of $CR^8CR^9$ and N (nitrogen atom) is more preferable, a structural moiety that forms a 5-membered nonaromatic heterocyclic ring is even more preferable, and a structural moiety that forms pyrrolidone is particularly preferable. This structural moiety may further have a substituent such as an alkyl group. X represents a group having a functional group having pKa of 14 or less. Y represents an oligomer chain or polymer chain having 40 to 10,000 atoms.

The dispersing agent (oligoimine-based dispersing agent) may further contain one or more kinds selected from the repeating units represented by Formulae (I-3), (I-4), and (I-5), as copolymer components. In a case where the dispersing agent includes the repeating unit, it is possible to further improve the dispersibility of the particles.

(I-3)

(I-4)

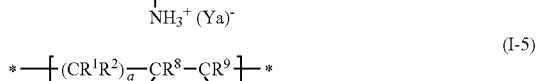

(I-5)

$R^1$, $R^2$, $R^8$, $R^9$, L, $L^a$, a, and * are the same as defined in Formulae (I-1), (I-2), and (I-2a). Ya represents an oligomer chain or polymer chain having an anionic group and having 40 to 10,000 atoms.

With respect to the oligoimine-based dispersing agent, the descriptions of paragraphs 0118 to 0190 of JP2015-034961A can be referred to, and the contents are incorporated in the present specification. Specific examples of the oligoimine-based dispersing agent include the following resins and resins disclosed in paragraphs 0169 to 0190 of JP2015-034961A.

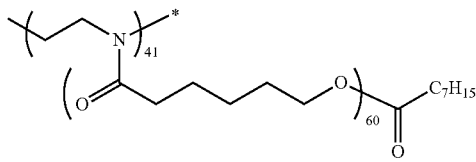

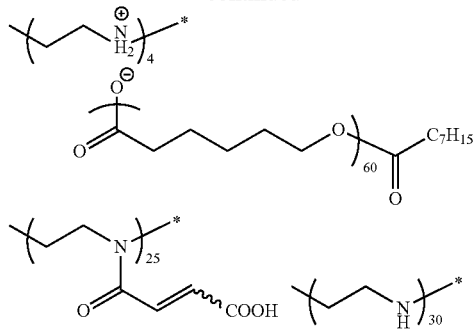

The dispersing agent can be obtained as a commercially available product, and specific examples thereof include DISPERBYK series (for example, DISPERBYK 103 and 111) manufactured by BYK-Chemie GmbH. The pigment dispersing agent disclosed in paragraphs 0041 to 0130 of JP2014-130338A can be used, and the contents thereof are incorporated in the present specification. The aforementioned resin having an acid group and the like can be used as the dispersing agent.

The content of the dispersing agent is preferably 0.1 to 40 mass % with respect to the total solid content of the composition. The upper limit is preferably 20 mass % or less and more preferably 10 mass % or less. The lower limit is preferably 0.5 mass % or more and more preferably 1 mass % or more.

The content of the dispersing agent is preferably 1 to 100 parts by mass with respect to 100 parts by mass of the metal particles. The upper limit is preferably 80 parts by mass or less and more preferably 60 parts by mass or less. The lower limit is preferably 2.5 parts by mass or more and more preferably 5 parts by mass or more.

<<Solvent>>

The composition according to the embodiment of the present invention preferably contains a solvent. The solvent can be formed by using various organic solvents. Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These organic solvents may be used singly or two or more kinds thereof may be used in combination.

According to the present invention, it is preferable to use a solvent with a less metal content, and the metal content of the solvent is preferably 10 mass ppb (parts per billion) or less. If necessary, the solvent having a mass ppt (parts per trillion) level may be used, and the high purity solvent is, for example, provided by Toyo Gosei Co., Ltd. (Japan Chemical Daily, Nov. 13, 2015).

Examples of the method for removing impurities such as metals from a solvent include distillation (molecular distillation, thin film distillation, and the like) filtered using a filter. The pore diameter of the filter used for filtration is preferably 10 nm or less, more preferably 5 nm or less, and even more preferably 3 nm or less. The material of the filter is preferably polytetrafluoroethylene, polyethylene, or nylon.

The solvent may include an isomer (a compound having the same number of atoms and different structures). Only one kind of isomers may be included, or a plurality of kinds of isomers may be included.

According to the present invention, it is preferable that the content of peroxide in the organic solvent preferably is 0.8 mmol/L or less, and it is more preferable that the organic solvent does not substantially include peroxide.

With respect to the content of the solvent, the concentration of compositions is preferably 5 to 99 mass %. The upper limit is more preferably 90 mass % or less. The lower limit is more preferably 10 mass % or more.

<<Curable Compound>>

The composition according to the embodiment of the present invention preferably contains a curable compound. As the curable compound, a well-known compound that can be cured by radical, acid, or heat can be used. Examples thereof include a compound having a group having an ethylenically unsaturated bond, a compound having an epoxy group, and a compound having a methylol group. Examples of the group having an ethylenically unsaturated bond include a vinyl group, a (meth)allyl group, a (meth)acryloyl group, and a (meth)acryloyloxy group, and a (meth)acryloyl group and a (meth)acryloyloxy group are preferable. The curable compound is preferably a polymerizable compound and is more preferably a radical polymerizable compound. Examples of the polymerizable compound include a compound having a group having an ethylenically unsaturated bond.

The content of the curable compound is preferably 1 to 80 mass % with respect to the total solid content of the composition. The lower limit is preferably 3 mass % or more and more preferably 5 mass % or more. The upper limit is more preferably 70 mass % or less and even more preferably 60 mass % or less. The curable compound may be used singly, and two or more kinds thereof may be used in combination. In a case where two or more kinds thereof are used in combination, it is preferable that the total amount is in the above range.

(Compound Having Group Having Ethylenically Unsaturated Bond (Polymerizable Compound))

According to the present invention, as the curable compound, a compound (hereinafter, referred to as a "polymerizable compound") having a group having an ethylenically unsaturated bond can be used. The polymerizable compound is preferably a monomer. The molecular weight of the polymerizable compound is preferably 100 to 3,000. The upper limit is preferably 2000 or less and more preferably 1,500 or less. The lower limit is preferably 150 or more and more preferably 250 or more. The polymerizable compound is preferably a 3 to 15 functional (meth)acrylate compound and more preferably a 3 to 6 functional (meth)acrylate compound.

As an example of the polymerizable compound, the description disclosed in paragraphs 0033 to 0034 of JP2013-253224A can be referred to, and the contents thereof are incorporated in the present specification. The polymerizable compound is preferably ethyleneoxy-modified pentaerythritol tetraacrylate (as a commercially available product, NK Ester ATM-35E; Shin-Nakamura Chemical Co., Ltd.), dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA; manufactured by Nippon Kayaku Co., Ltd. and A-DPH-12E; manufactured by Shin-Nakamura Chemical Co., Ltd.), and a structure in which these (meth)acryloyl groups are bonded to each other via an ethylene glycol residue and/or a propylene glycol residue. Oligomer types thereof may be used. Preferably, for example, paragraphs 0034 to 0038 of JP2013-253224A can be referred to, and the contents thereof are incorporated in the present specification. Examples of the resin having an acid group include polymerizable monomers disclosed in paragraphs 0477 (corresponding to paragraph 0585 of US2012/0235099A) of JP2012-208494A, and the contents thereof are incorporated into the present specification. Diglycerol ethylene oxide (EO)-modified (meth)acrylate (as a commercially available product, M-460; manufactured by Toagosei Co., Ltd.), pentaerythritol tetraacrylate (manufactured by Shin-Nakamura Chemical Co., Ltd., A-TMMT), and 1,6-hexanediol diacrylate (manufactured by Nippon Kayaku Co., Ltd., KAYARAD HDDA) are also preferable. Oligomer types thereof may be used. Examples thereof include RP-1040 (manufactured by Nippon Kayaku Co., Ltd.).

The polymerizable compound may have an acid group such as a carboxyl group, a sulfo group, and a phosphoric acid group. Examples of the polymerizable compound having an acid group include an ester of an aliphatic polyhydroxy compound and unsaturated carboxylic acid. A polymerizable compound obtained by causing an unreacted hydroxy group of an aliphatic polyhydroxy compound to react with a nonaromatic carboxylic acid anhydride to have acid group is preferable, and it is particularly preferable that the aliphatic polyhydroxy compound in this ester is pentaerythritol and/or dipentaerythritol. Examples of commercially available products include M-305, M-510, and M-520 of the Aronix series as polybasic acid-modified acrylic oligomers manufactured by Toagosei Co., Ltd. The acid value of the polymerizable compound having an acid group is preferably 0.1 to 40 mg KOH/g. The lower limit is preferably 5 mgKOH/g or more. The upper limit is preferably 30 mgKOH/g or less.

A compound having a caprolactone structure is also a preferable embodiment polymerizable compound. The polymerizable compound having a caprolactone structure is not particularly limited, as long as the polymerizable compound has a caprolactone structure in a molecule, and examples thereof include ε-caprolactone modified polyfunctional (meth)acrylate obtained by esterifying (meth)acrylic acid and ε-caprolactone with polyhydric alcohol such as trimethylol ethane, ditrimethylol ethane, trimethylolpropane, ditrimethylolpropane, pentaerythritol, dipentaerythritol, tripentaerythritol, glycerin, diglycerol, and trimethylolmelamine. As the polymerizable compound having a caprolactone structure, the description disclosed in paragraphs 0042 to 0045 of JP2013-253224A can be referred to, and the contents thereof are incorporated in the present specification. Examples of the polymerizable compound having a caprolactone structure include DPCA-20, DPCA-30, DPCA-60, and DPCA-120 which are commercially available as a KAYARAD DPCA series from Nippon Kayaku Co., Ltd, and SR-494 as tetrafunctional acrylate having four ethyleneoxy chains and TPA-330 as trifunctional acrylate having three isobutyleneoxy chains which are manufactured by Sartomer.

As the polymerizable compound, urethane acrylates disclosed in JP1973-041708B (JP-S48-041708B), JP1976-037193A (JP-S51-037193A), JP1990-032293B (JP-H02-032293B), and JP1990-016765B (JP-H02-016765B), and urethane compounds having an ethylene oxide skeleton disclosed in JP1983-049860B (JP-S58-049860B), JP1981-017654B (JP-S56-017654B), JP1987-039417B (JP-S62-039417B), and JP1987-039418B (JP-S62-039418B). Addition polymerizable compounds having an amino structure or a sulfide structure in a molecule which are disclosed in JP1988-277653A (JP-S63-277653A), JP1988-260909A (JP-S63-260909A), and JP1989-105238A (JP-H01-105238A) can be used. Examples of commercially available products include a urethane oligomer UAS-10 and UAB-140 (manufactured by Nippon Paper Industries Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

The content of the polymerizable compound is preferably 1 to 80 mass % with respect to the total solid content of the composition. The lower limit is preferably 3 mass % or more and more preferably 5 mass % or more. The upper limit is more preferably 70 mass % or less and even more preferably 60 mass % or less.

(Compound Having Epoxy Group)

According to the present invention, a compound having an epoxy group can be used as the curable compound. Examples of the compound having an epoxy group include a compound having one or more epoxy groups in one molecule, and a compound having two or more epoxy groups in one molecule is preferable. It is preferable that 1 to 100 epoxy groups are included in one molecule. For example, the upper limit can be 10 or less and can be 5 or less. The lower limit is preferably 2 or more.

With respect to the compound having an epoxy group, the epoxy equivalent (=molecular weight of compound having epoxy group/the number of epoxy groups) is preferably 500 g/equivalent or less, more preferably 100 to 400 g/equivalent, and even more preferably 100 to 300 g/equivalent.

The compound having an epoxy group may be any one of a low molecule compound (for example, having molecular weight of less than 1,000) or a high molecule compound (macromolecule) (for example, having a molecular weight of 1,000 or more, in a case of a polymer, having a weight-average molecular weight of 1,000 or more). The weight-average molecular weight of the compound having an epoxy group is preferably 200 to 100,000 and more preferably 500 to 50,000. The upper limit of the weight-average molecular weight is preferably 10,000 or less, more preferably 5,000 or less, and even more preferably 3,000 or less.

As the compound having an epoxy group, a commercially available product can also be used. Examples thereof include EHPE3150 (manufactured by Daicel Corporation) and EPICLON N-695 (manufactured by DIC Corporation).

According to the present invention, as the compound having an epoxy group, compounds disclosed in paragraphs 0034 to 0036 of JP2013-011869A, paragraphs 0147 to 0156 of JP2014-043556A, and paragraphs 0085 to 0092 of JP2014-089408A can be used. The contents thereof are incorporated in the present specification.

The content of the compound having an epoxy group is preferably 1 to 80 mass % with respect to the total solid content of the composition. The lower limit is preferably 3 mass % or more and more preferably 5 mass % or more. The upper limit is preferably 70 mass % or less and more preferably 60 mass % or less. The compound having an epoxy group may be used singly or two or more kinds thereof may be used in combination. In a case where two or more kinds thereof are used, it is preferable that the total amount thereof is in the above range.

<<Photopolymerization Initiator>>

The composition according to the embodiment of the present invention can contain a photopolymerization initiator. Particularly, in a case where the composition according to the embodiment of the present invention includes a radically polymerizable compound, it is preferable that the photopolymerization initiator is contained. The photopolymerization initiator is not particularly limited, and the photopolymerization initiator can be selected from well-known photopolymerization initiators. For example, the compound having the photosensitivity to light from the ultraviolet region to the visible region is preferable. The photopolymerization initiator is preferably a photo radical polymerization initiator.

Examples of the photopolymerization initiator include a halogenated hydrocarbon derivative (for example, a compound having a triazine skeleton or a compound having an oxadiazole skeleton), an acylphosphine compound such as acylphosphine oxide, hexaarylbiimidazole, an oxime compound such as an oxime derivative, organic peroxide, a thio compound, a ketone compound, aromatic onium salt, keto oxime ether, an aminoacetophenone compound, and hydroxyacetophenone. Examples of the halogenated hydrocarbon compound having a triazine skeleton include compounds disclosed in Bull. Chem. Soc. Japan, 42, 2924 (1969) written by Wakabayashi et al., compounds disclosed in GB1388492B, compounds disclosed in JP1978-133428A (JP-S53-133428A), compounds disclosed in DE3337024B, compounds disclosed in J. Org. Chem.; 29, 1527 (1964) written by F. C. Schaefer et al., compounds disclosed in JP1987-058241A (JP-S62-058241A), compounds disclosed in JP1993-281728A (JP-H05-281728A), compounds disclosed in JP1993-034920A (JP-H05-034920A), and compounds disclosed in U54212976A.

In view of exposure sensitivity, the photopolymerization initiator is preferably a compound selected from the group consisting of a trihalomethyl triazine compound, a benzyl dimethyl ketal compound, an α-hydroxy ketone compound, an α-aminoketone compound, an acylphosphine compound, a phosphine oxide compound, a metallocene compound, an oxime compound, a triaryl imidazole dimer, an onium compound, a benzothiazole compound, a benzophenone compound, an acetophenone compound, a cyclopentadiene-benzene-iron complex, a halomethyl oxadiazole compound, and a 3-aryl substituted coumarin compound.

As the photopolymerization initiator, an α-hydroxyketone compound, an α-aminoketone compound, and an acylphosphine compound may also be suitably used. More specifically, for example, α-aminoketone compounds disclosed in JP1998-291969A (JPH10-291969A) and acylphosphine compounds disclosed in JP4225898B can also be used. As the α-hydroxyketone compound, IRGACURE-184, DAROCUR-1173, IRGACURE-500, IRGACURE-2959, and IRGACURE-127 (above are manufactured by BASF SE) can be used. As the α-aminoketone compound, IRGACURE-907, IRGACURE-369, IRGACURE-379, and IRGACURE-379EG (all manufactured by BASF SE) can be used. As the α-aminoketone compound, a compound disclosed in JP2009-191179A can be used. As the acylphosphine compound, IRGACURE-819 and DAROCUR-TPO (all manufactured by BASF) which are commercially available products can be used.

As the photopolymerization initiator, an oxime compound can also be preferably used. Specific examples of the oxime compound include compounds disclosed in JP2001-233842A, compounds disclosed in JP2000-080068A, compounds disclosed in JP2006-342166A, and compounds disclosed in JP2016-021012A. According to the present invention, examples of the oxime compound that can be preferably used include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy) iminobutan-2-one, and 2-ethoxycarbonyloxyimino-1-phenylpropan-1-one.

Examples thereof also include compounds disclosed in J. C. S. Perkin II (1979), pp. 1653 to 1660, J. C. S. Perkin II (1979), pp. 156 to 162, Journal of Photopolymer Science and Technology (1995), pp. 202 to 232, and compounds disclosed in JP2000-066385A, JP2000-080068A, JP2004-534797A, and JP2006-342166A.

As commercially available products, IRGACURE-OXE01, IRGACURE-OXE02, IRGACURE-OXE03, and IRGACURE-OXE04 (above are manufactured by BASF SE) are also suitably used. TR-PBG-304 (manufactured by Changzhou Tronly New Electronic Materials Co., Ltd.), ADEKA ARKLES NCI-831 (manufactured by ADEKA Corporation), ADEKA ARKLES NCI-930 (manufactured by ADEKA Corporation), and ADEKA OPTOMER N-1919 (manufactured by ADEKA Corporation, Photopolymerization Initiator 2 of JP2012-014052A) can be also used.

As oxime compounds in addition to the above, a compound disclosed in JP2009-519904A in which oxime is linked to an N position of a carbazole ring, a compound disclosed in U.S. Pat. No. 7,626,957B in which a hetero substituent is introduced at a benzophenone moiety, a compound disclosed in JP2010-015025A and US2009-0292039A in which a nitro group is introduced at a dye moiety, a ketoxime compound disclosed in US2009-0131189A, a compound disclosed in U.S. Pat. No. 7,556,910B in which a triazine skeleton and an oxime skeleton are contained in the same molecule, and a compound disclosed in JP2009-221114A which has an absorption maximum at 405 nm and has good sensitivity to a g-line light source may be used.

As the oxime compound, a compound represented by Formula (OX-1) can be more preferably used. With respect to the oxime compound, an N—O bond of the oxime may be an oxime compound of the (E) body, and the N—O bond of oxime may be an oxime compound of the (Z) body or may be a mixture of (E) body and (Z) body.

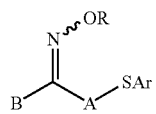

(OX-1)

In Formula (OX-1), R and B each independently represent a monovalent substituent, A represents a divalent organic group, and Ar represents an aryl group. With respect to the details of Formula (OX-1), the description of paragraphs 0276 to 0304 of JP2013-029760A can be referred to, and the contents thereof are incorporated into the present specification.

According to the present invention, as the photopolymerization initiator, an oxime compound having a fluorene ring can also be used. Specific examples of the oxime compound having a fluorene ring include compounds disclosed in JP2014-137466A. The contents thereof are incorporated in the present specification.

According to the present invention, as the photopolymerization initiator, an oxime compound having a fluorine atom can also be used. Specific examples of the oxime compound having a fluorine atom include compounds disclosed in JP2010-262028A, compounds 24 and 36 to 40 disclosed in JP2014-500852A, and Compound (C-3) of JP2013-164471A. The contents thereof are incorporated in the present specification.

According to the present invention, as the photopolymerization initiator, an oxime compound having a nitro group can be used. The oxime compound having a nitro group is also preferably a dimer. Specific examples of the oxime compound having a nitro group include compounds disclosed in paragraphs 0031 to 0047 JP2013-114249A and paragraphs 0008 to 0012 and 0070 to 0079 of JP2014-137466A, compounds disclosed in paragraphs 0007 to 0025 JP4223071B, and ADEKA ARKLES NCI-831 (manufactured by ADEKA Corporation).

Specific examples of the oxime compound that is preferably used in the present invention are provided below, and the present invention is not particularly limited.

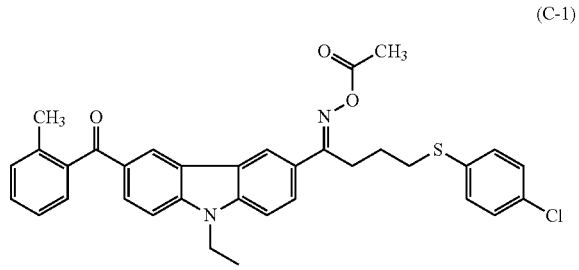

(C-1)

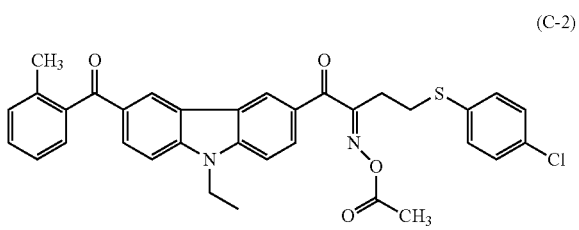

(C-2)

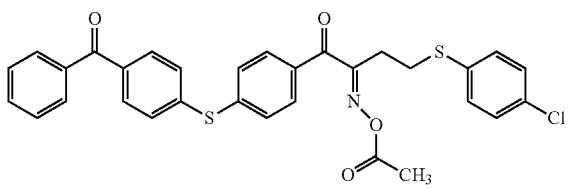

(C-3)

-continued
(C-4)
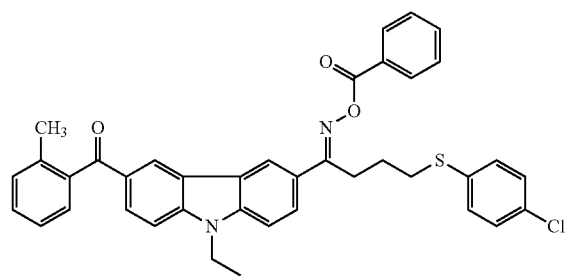
(C-5)
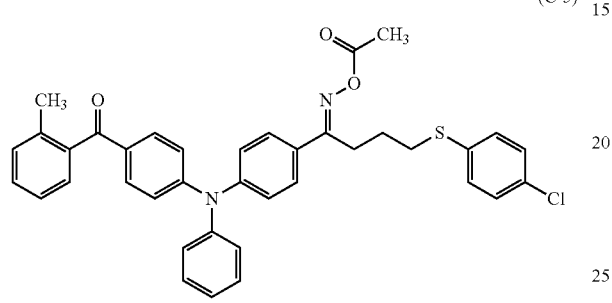
(C-6)
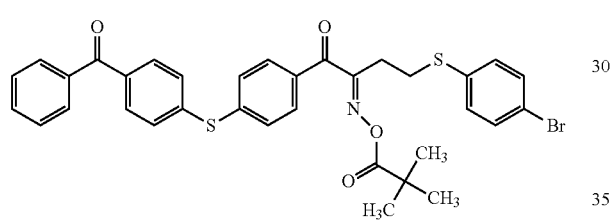
(C-7)
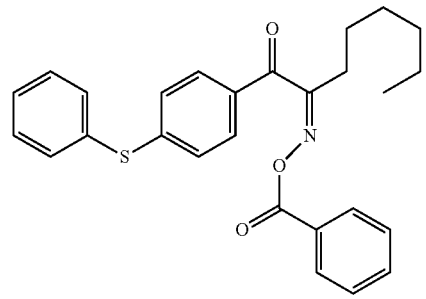
(C-8)
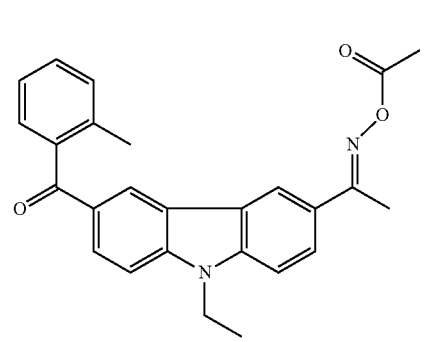
-continued
(C-9)
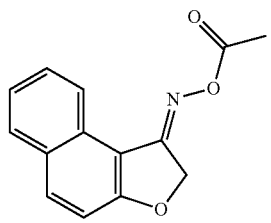
(C-10)
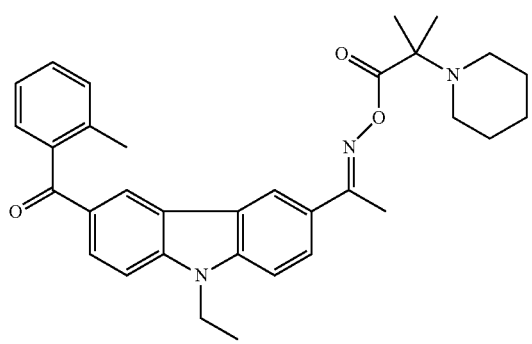
(C-11)
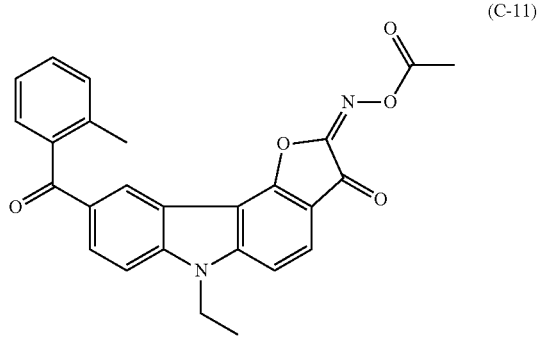
(C-12)
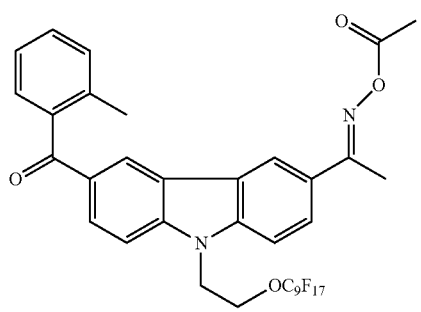
(C-13)
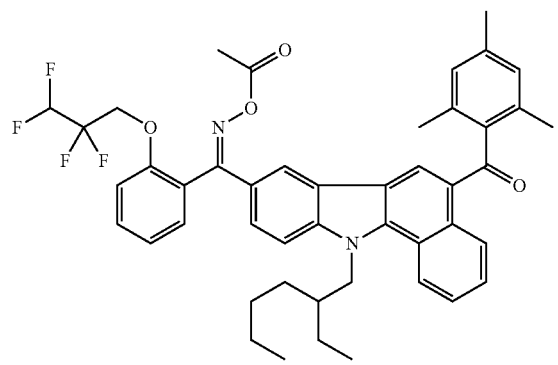

-continued (C-14)

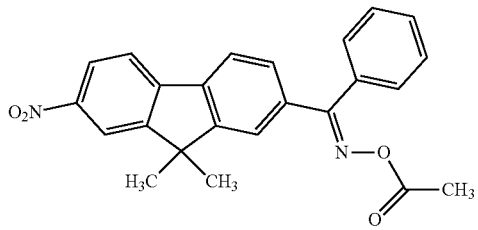

The oxime compound is preferably a compound having an absorption maximum in a wavelength range of 350 nm to 500 nm and more preferably a compound having an absorption maximum in a wavelength range of 360 nm to 480 nm. The oxime compound is preferably a compound having a high absorbance at 365 nm and 405 nm.

In view of sensitivity, with respect to the oxime compound, a molar light absorption coefficient at 365 nm or 405 nm is preferably 1,000 to 300,000, more preferably 2,000 to 300,000, and particularly preferably 5,000 to 200,000.

The molar light absorption coefficient of the compound can be measured using a well-known method. For example, it is preferable to measure the molar light absorption coefficient with an ultraviolet-visible spectrophotometer (Cary-5 spectrophotometer manufactured by Varian Medical Systems, Inc.) by using an ethyl acetate solvent at a concentration of 0.01 g/L.

The photopolymerization initiator preferably includes an oxime compound and an α-aminoketone compound. By using the both in combination, developability is improved and a pattern having excellent rectangularity is easily formed. In a case where the oxime compound and the α-aminoketone compound are used in combination, the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and even more preferably 1 to 20 mass % with respect to the total solid content of the composition. In a case where the content of the photopolymerization initiator is within the above range, it is possible to obtain more satisfactory sensitivity and pattern formability. The composition according to the embodiment of the present invention may include the photopolymerization initiator singly or may include two or more kinds thereof. In a case where two or more kinds of the photopolymerization initiators are contained, the total amount thereof is preferably in the above range.

<<Antioxidant>>

The composition according to the embodiment of the present invention preferably contains an antioxidant. Examples of the antioxidant include a phenol compound, a phosphoric ester acid compound, and a thioether compound. The antioxidant is more preferably a phenol compound having a molecular weight of 500 or more, a phosphoric ester acid compound having a molecular weight of 500 or more, or a thioether compound having a molecular weight of 500 or more. Two or more kinds thereof may be used in a mixture. As the phenol compound, any phenol compound known as a phenol-based antioxidant can be used, and polysubstituted phenol-based compounds are preferable. The polysubstituted phenol-based compounds are largely divided into three types (a hindered type, a semi-hindered type, and a less hindered type) of which substitution positions and structures are different. As the antioxidant, a compound having a phenol group and a phosphoric acid ester group in the same molecule can be preferably used. As the antioxidant, a phosphorus-based antioxidant can also be suitably used. Examples of the phosphorus-based antioxidant include tris [2-[[2,4,8,10-tetrakis(1,1-dimethylethyl)dibenzo[d,f] [1,3,2]dioxaphosphepin-6-yl]oxy]ethyl]amine, tris[2-[(4,6,9,11-tetra-tert-butyldibenzo[d,f] [1,3,2] dioxaphosphepin-2-yl) oxy]ethyl], and ethylbis(2,4-di-tert-butyl-6-methylphenyl) phosphite. As the antioxidant, a commercially available product can be used. Examples of the commercially available products of the antioxidant include ADEKASTAB AO-20, ADEKASTAB AO-30, ADEKASTAB AO-40, ADEKASTAB AO-50, ADEKASTAB AO-50F, ADEKASTAB AO-60, ADEKASTAB AO-60G ADEKASTAB AO-80, and ADEKASTAB AO-330 (ADEKA Corporation). As the antioxidant, the description of paragraphs 0033 to 0043 of JP2014-032380A can be referred to, and the contents thereof are incorporated in the present specification.

The content of the antioxidant is preferably 0.01 to 20 mass % and more preferably 0.3 to 15 mass % with respect to the total solid content of the composition. The antioxidant may be used singly or two or more kinds thereof may be used. In a case where two or more kinds are used, it is preferable that the sum thereof is in the above range.

<<Silane Coupling Agent>>

The composition according to the embodiment of the present invention can contain a silane coupling agent. According to the present invention, the silane coupling agent means a silane compound having a hydrolyzable group and other functional group. The hydrolyzable group refers to a substituent which is directly connected to a silicon atom and can generate a siloxane bond by at least any one of hydrolysis reaction or condensation reaction. Examples of the hydrolyzable group include a halogen atom, an alkoxy group, and an acyloxy group, and an alkoxy group is preferable. That is, the silane coupling agent is preferably a compound having an alkoxysilyl group. The functional group other than the hydrolyzable group is preferably a group exhibiting affinity by using interaction between resins or forming a bond with the resin. Examples thereof include a vinyl group, a styryl group, a (meth)acryloyl group, a mercapto group, an epoxy group, an oxetanyl group, an amino group, a ureido group, a sulfide group, an isocyanate group, a phenyl group, and a (meth)acryloyl group and an epoxy group are preferable.

Specific examples of the silane coupling agent include 3-methacryloxypropylmethyldimethoxysilane. Examples of the silane coupling agent include compounds disclosed in paragraphs 0018 to 0036 of JP2009-288703A and compounds disclosed in paragraphs 0056 to 0066 of JP2009-242604A, and the contents thereof are incorporated in the present specification. As the silane coupling agent, a commercially available product can be used. Examples of commercially available products of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238, which are manufactured by Shin-Etsu Chemical Co., Ltd.

The content of the silane coupling agent is preferably 0.01 to 15.0 mass % and more preferably 0.05 to 10.0 mass % with respect to the total solid content of the composition. The silane coupling agent may be used singly or two or more kinds thereof may be used. In a case where two or more kinds thereof are used, the total amount thereof is preferably in the above range.

<<Sensitizing Agent>>

The composition according to the embodiment of the present invention may contain a sensitizing agent for the purpose of improving the radical generation efficiency of the photopolymerization initiator and increasing the wavelength of the photosensitive wavelength. As the sensitizing agent, it is preferable to sensitize the photopolymerization initiator with an electron moving mechanism or an energy moving mechanism. Examples of the sensitizing agent include a sensitizing agent having an absorption wavelength in the wavelength range of 300 nm to 450 nm. Specifically, the description of paragraph 0231 to 0253 (paragraphs 0256 to 0273 of corresponding US2011/0124824A) of JP2010-106268A can be referred to, and the contents thereof are incorporated in the present specification.

The content of the sensitizing agent is preferably 0.1 to 20 mass % and more preferably 0.5 to 15 mass % with respect to the total solid content of the composition. The sensitizing agent may be used singly or two or more kinds thereof may be used. In a case where two or more kinds are used, it is preferable that the sum thereof is in the above range.

<<Co-Sensitizer>>

It is preferable that the composition according to the embodiment of the present invention further contains a co-sensitizer. The co-sensitizer has an effect of further improving the sensitivity of the photopolymerization initiator and the sensitizing agent to actinic radiation or suppressing polymerization inhibition of the polymerizable compound. As the co-sensitizer, specifically, the description of paragraphs 0254 to 0257 (paragraphs 0277 to 0279 of corresponding US2011/0124824A) of JP2010-106268A is referred to, and the contents thereof are incorporated in the present specification.

In view of the improvement of the polymerization growth rate and the curing rate, the content of the co-sensitizer is preferably 0.1 to 30 mass %, more preferably 1 to 25 mass %, and even more preferably 1.5 to 20 mass % with respect to the total solid content of the composition. The co-sensitizer may be used singly, or two or more kinds thereof may be used. In a case where two or more kinds are used, it is preferable that the sum thereof is in the above range.

<<Polymerization Inhibitor>>

The composition according to the embodiment of the present invention preferably contains a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol), and N-nitrosophenylhydroxyamine salt (ammonium salt, primary cerium salt, and the like). Among these, p-methoxyphenol is preferable. The polymerization inhibitor may function as an antioxidant.

The content of the polymerization inhibitor is preferably 0.01 parts by mass to 10 parts by mass, more preferably 0.01 to 8 parts by mass, and most preferably 0.01 to 5 parts by mass with respect to 100 parts by mass of the photopolymerization initiator.

<<Surfactant>>

In view of further improving coatability, the composition according to the embodiment of the present invention may contain various surfactants. As the surfactant, various kinds of surfactants such as a fluorine-based surfactant, a nonionic surfactant, a cationic surfactant, an anionic surfactant, and a silicone-based surfactant may be used. With respect to the surfactants, paragraphs 0238 to 0245 of WO2015/166779A can be referred to, and the contents thereof are incorporated into the present specification.

Particularly, by causing the composition according to the embodiment of the present invention to contain a fluorine-based surfactant, the liquid properties (particularly, fluidity) in a case of being prepared as a coating liquid are further improved and uniformity after coating or liquid saving performance can be further improved. In the case where a film is formed by using a coating liquid to which a composition containing a fluorine-based surfactant is applied, the interfacial tension between the surface to be coated and the coating liquid are reduced, the coatability on the surface to be coated is improved, and wettability to the surface to be coated is improved. Therefore, it is possible to more suitably form an even thickness film having small thickness unevenness.

The fluorine content of the fluorine-based surfactant is appropriately 3 to 40 mass %, more preferably 5 to 30 mass %, and particularly preferably 7 to 25 mass %. The fluorine-based surfactant in a case where the fluorine content is in this range is effective in view of the uniformity of the thickness of the coating film and liquid saving performance, and has favorable solubility in the composition.

Specific examples of the fluorine-based surfactant include surfactants disclosed in paragraphs 0060 to 0064 (paragraphs 0060 to 0064 of WO2014/017669A) of JP2014-41318A and surfactants disclosed in paragraphs 0117 to 0132 of JP2011-132503A, and the contents thereof are incorporated in the present specification. Examples of the commercially available products of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (above, manufactured by DIC Corporation), FLUORAD FC430, FLUORAD FC431, and FLUORAD FC171 (above, manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON-393, and SURFLON KH-40 (above, manufactured by Asahi Glass Co., Ltd.), and PolyFox PF636, PF656, PF6320, PF6520, and PF7002 (above are manufactured by OMNOVA Solutions Inc.).

The fluorine-based surfactant has a molecular structure having a functional group containing a fluorine atom, and an acrylic compound in which a portion of a functional group containing a fluorine atom is broken in a case where heat is applied and the fluorine atom volatilizes can also be suitably used. Examples of the fluorine-based surfactant include MEGAFACE DS series (Chemical Daily, Feb. 22, 2016) (The Nikkei Sangyo Shimbun, Feb. 23, 2016), for example, MEGAFACE DS-21 which are manufactured by DIC Corporation, and these can be used.

As the fluorine-based surfactant, a block polymer can also be used. Examples thereof include compounds disclosed in JP2011-089090A. As the fluorine-based surfactant, a fluorine-containing polymer compound including a repeating unit derived from a (meth)acrylate compound having a fluorine atom and a repeating unit derived from a (meth)acrylate compound having at least two or more (preferably five or more) alkyleneoxy groups (preferably an ethyleneoxy group and a propyleneoxy group) can also be preferably used. The following compounds are also exemplified as the fluorine-based surfactant used in the present invention.

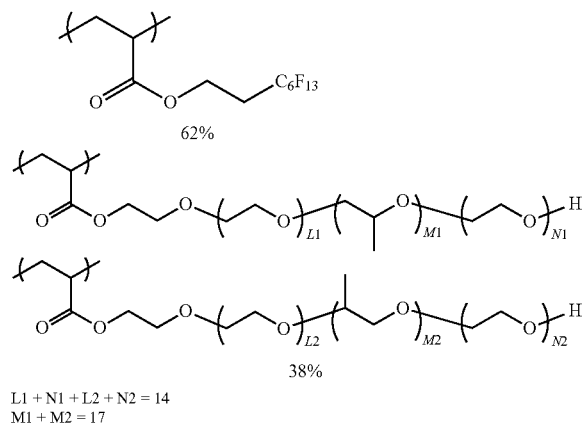

L1 + N1 + L2 + N2 = 14
M1 + M2 = 17

The weight-average molecular weight of the compound is preferably 3,000 to 50,000, and for example, 14,000. In the compound, % that indicates a proportion of the repeating unit is mol %.

As the fluorine-based surfactant, a fluorine-containing polymer having an ethylenically unsaturated group on a side chain can be used. Examples of the specific examples include compounds disclosed in paragraphs 0050 to 0090 and paragraphs 0289 to 0295 of JP2010-164965A, for example, MEGAFACE RS-101, RS-102, RS-718K, and RS-72-K manufactured by DIC Corporation. As the fluorine-based surfactant, compounds disclosed in paragraphs 0015 to 0158 of JP2015-117327A can be used.

Examples of the nonionic surfactant include glycerol, trimethylolpropane, trimethylol ethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate, and sorbitan fatty acid ester, PLURONIC L10, L31, L61, L62, 10R5, 17R2, and 25R2 (manufactured by BASF SE), TETRONIC 304, 701, 704, 901, 904, and 150R1 (manufactured by BASF SE), SOL SPERSE 20000 (manufactured by Lubrizol Japan Limited), NCW-101, NCW-1001, and NCW-1002 (manufactured by FUJIFILM Wako Pure Chemical Corporation), PIONIN D-6112, D-6112-W, and D-6315 (manufactured by Takemoto Oil & Fat Co., Ltd.), and OLFINE E1010 and SURFYNOL 104, 400, and 440 (manufactured by Nissin Chemical Industry Co., Ltd.).

The content of the surfactant is preferably 0.001 mass % to 5.0 mass % and more preferably 0.005 to 3.0 mass % with respect to the total solid content of the composition. The surfactant may be used singly or two or more kinds thereof may be used. In a case where two or more kinds are used, it is preferable that the sum thereof is in the above range.

<<Ultraviolet Absorbing Agent>>

The composition according to the embodiment of the present invention may contain an ultraviolet absorbing agent. As the ultraviolet absorbing agent, a conjugated diene compound, an aminodiene compound, a salicylate compound, a benzophenone compound, a benzotriazole compound, an acrylonitrile compound, a hydroxyphenyl triazine compound, or the like can be used. With respect to the details thereof, the description of paragraphs 0052 to 0072 of JP2012-208374A and paragraphs 0317 to 0334 of JP2013-068814A can be referred to, and the contents of these are incorporated in this specification. Examples of the commercially available products of the conjugated diene compound include UV-503 (manufactured by Daito Chemical Co., Ltd.). As the benzotriazole compound, MYUA series (Japan Chemical Daily, Feb. 1, 2016) manufactured by Miyoshi Oils and Fats Co., Ltd. may be used.

The content of the ultraviolet absorbing agent is preferably 0.1 to 10 mass %, more preferably 0.1 to 5 mass %, and particularly preferably 0.1 to 3 mass % with respect to the total solid content of the composition. The ultraviolet absorbing agent may be used singly or two or more kinds thereof may be used. In a case where two or more kinds are used, it is preferable that the sum thereof is in the above range.

<<Other Additives>>

The composition according to the embodiment of the present invention can contain well-known additives such as a plasticizer and a greasing agent. Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerin. The content of the plasticizer is preferably 10 mass % or less with respect to the mass of the resin.

The composition according to the embodiment of the present invention can contain a colorant. The colorant may be a pigment or a dye. The content of the colorant is preferably 0.1 to 70 mass %, more preferably 1 to 50 mass %, and even more preferably 10 to 40 mass % with respect to the total solid content of the composition. The colorant may be used singly or two or more kinds thereof may be used. In a case where two or more kinds are used, it is preferable that the sum thereof is in the above range. The composition according to the embodiment of the present invention may not contain a colorant substantially. In the expression "not containing a colorant substantially", the content is preferably 0.1 mass % or less and more preferably 0.05 mass % or less with respect to the total solid content of the composition, and it is even more preferable that a colorant is not contained.

<<Method of Preparing Composition>>

The composition according to the embodiment of the present invention can be prepared by mixing the above component. In a case of preparing the composition, the respective components are collectively formulated, or sequentially formulated after the respective components are dissolved or dispersed in a solvent. The order of introduction and the working conditions for formulation are not particularly limited. For example, the composition may be prepared by simultaneously dissolving or dispersing all components in an organic solvent. For example, it is possible to prepare the composition, for example, by dispersing a metal particle in a solvent and a resin to prepare a dispersion liquid and mixing the obtained dispersion liquid and other components (for example, a binder or a curable compound).

It is preferable that the method of preparing the composition includes a process of dispersing metal particles. In the process of dispersing the metal particles, examples of the mechanical force used for dispersing the metal particles include compression, squeezing, impact, shearing, and cavitation. Specific examples of the process include a bead mill, a sand mill, a roll mill, a ball mill, a paint shaker, a micro fluidizer, a high speed impeller, a sand grinder, a flow jet mixer, high pressure wet atomization, and ultrasonic dispersion. In pulverizing the particles in the sand mill (bead mill), it is preferable to perform a treatment under the condition of increasing the pulverization efficiency by using beads with a small diameter, increasing a filling rate of the beads, or the like. It is preferable to remove the coarse particles by filtration, centrifugation or the like after the pulverization treatment. With respect to the processes and the dispersing machines for dispersing metal particles, processes and dispersing machines disclosed in "Complete work on dispersion technology, Johokiko Co., Ltd., Jul. 15, 2005" or "Actual comprehensive data collection on dispersion technology and industrial application centered on suspension (solid/liquid dispersion system), Publishing department of Management Development Center, Oct. 10, 1978", and paragraph 0022 of JP2015-157893A can be appropriately used. In the process of dispersing the metal particles, fine processing of the particles may be performed in the salt milling process. With respect to materials, equipment, processing conditions and the like used salt milling process, the description disclosed in, for example, JP2015-194521A and JP2012-046629A can be referred to.

In the preparation of the composition, it is preferable to filtrate the composition with a filter for the purpose of removing foreign matters and reducing defects. The filter can be used without any particular limitation as long as the filter is used in the related art for filtration purposes or the like. Examples thereof include a filter using a material such as a fluororesin such as polytetrafluoroethylene (PTFE), a polyamide resin such as nylon (for example, nylon-6 and nylon-6,6), and a polyolefin resin such as polyethylene and polypropylene (PP) (including a polyolefin resin with high density and ultra high molecular weight). Among these materials, polypropylene (including high density polypropylene) and nylon are preferable.

The pore diameter of the filter is appropriately about 0.01 to 7.0 μm, preferably about 0.01 to 3.0 μm, and more preferably about 0.05 to 0.5 μm. In a case where the pore diameter of the filter is in the above range, fine foreign matters can be securely removed. It is also preferable to use a fibrous filter medium. Examples of the fibrous filter medium include a polypropylene fiber, a nylon fiber, and a glass fiber. Specific examples thereof include filter cartridges of SBP type series (SBP008 and the like), TPR type series (TPR002, TPR005, and the like), and SHPX type series (SHPX003 and the like) manufactured by Rok Techno Co., Ltd.

In a case of using the filter, different filters (for example, the first filter and the second filter) may be combined. At that time, filtration with each filter may be performed only once or may be performed twice or more times.

It is also possible to combine filters having different pore diameters within the above range. Here, as the pore diameters, nominal values of the filter manufacturer can be referred to. As commercially available filters, for example, a filter can be selected from various filters provided by Nihon Pall Ltd. (DFA 4201 NXEY, and the like), Advantec Toyo Kaisha, Ltd., Entegris Japan Co., Ltd. (formerly Japan Mykrolis Corporation), or Kitz Micro Filter Corporation.

As the second filter, a filter formed of the same material as the first filter described above can be used.

The filtration with the first filter may be performed only with the dispersion liquid, and the filtration with the second filter may be performed after mixing other components.

<<Application of Composition>>

The composition according to the embodiment of the present invention can be preferably used for forming a far infrared ray transmitting filter or the like. Specifically, the composition can be preferably used for a far infrared ray transmitting filter that selectively transmits light at a specific wavelength in the wavelength range of 1 to 14 μm. More specifically, the far infrared ray transmitting composition can be preferably used for a far infrared ray transmitting filter used for inspection equipment and a sensor using far infrared rays, a far infrared ray transmitting filter used for a sensor using far infrared rays such as current collecting sensors, and a substrate material for measuring far infrared ray transmittance. Further, the composition according to the embodiment of the present invention can also be used as an antireflection film. The far infrared ray transmitting filter can be also formed only with the composition according to the embodiment of the present invention. The composition according to the embodiment of the present invention and another substrate can be combined so as to obtain a far infrared ray transmitting filter. For example, a laminate formed by applying the composition according to the embodiment of the present invention to the substrate (for example, a Ge substrate or a Si substrate) is preferably used as the far infrared ray transmitting filter.

The composition according to the embodiment of the present invention can be applied to a substrate by a method such as coating and a formed body having excellent far infrared ray transmitting performance can be manufactured by using various forming methods such as injection, pressing, and extrusion. The formed body can be manufactured by using a well-known ceramic manufacturing method. Specific examples thereof include a die press forming method, a rubber pressing method, an injection molding method, a slip casting method, and an extrusion forming method.

<Formed Body>

Subsequently, the formed body according to the embodiment of the present invention is described below. The formed body according to the embodiment of the present invention is obtained by using the composition according to the embodiment of the present invention described above.

With respect to the formed body according to the embodiment of the present invention, the average refractive index is preferably 1.3 to 5.0 in the wavelength range of 8 to 14 The lower limit is preferably 1.35 or more and more preferably 1.4 or more. The upper limit is preferably 4.5 or less and more preferably 4.0 or less.

With respect to the formed body according to the embodiment of the present invention, the refractive index at the wavelength of 10 μm is preferably 1.3 to 5.0. The lower limit is preferably 1.35 or more and more preferably 1.4 or more. The upper limit is preferably 4.5 or less and more preferably 4.0 or less.

With respect to the formed body according to the embodiment of the present invention, the refractive index is preferably 1.3 to 5.0 in all of the wavelength range of 8 to 14 μm. The lower limit is preferably 1.35 or more and more preferably 1.4 or more. The upper limit is preferably 4.5 or less and more preferably 4.0 or less.

The refractive index and the average refractive index of the formed body are values measured by using IR-VASE manufactured by J. A. Woollam Co. With respect to the average refractive index, an average value of the refractive index of the light in the wavelength range of 8 to 14 µm of the measured sample is set as the average refractive index.

The shape of the formed body according to the embodiment of the present invention is not particularly limited and can be appropriately adjusted according to the application. Examples thereof include a film shape, a flat sheet shape, or a lens shape. In a case of a film-shaped formed body, the thickness is preferably 0.1 to 5.0 µm, more preferably 0.2 to 4.0 µm, and even more preferably 0.3 to 3.0 µm. In a case of a flat sheet-shaped formed body, the thickness is preferably 100 to 10,000 µm, more preferably 200 to 8,000 µm, and even more preferably 500 to 5,000 µm. The lens-shaped formed body may be a concave lens or a convex lens. The thickness of the lens can be appropriately adjusted.

The formed body according to the embodiment of the present invention and a far infrared ray transmitting filter according to the embodiment of the present invention preferably have spectral properties of any one of (1) to (4) below. The transmittances of the formed body and a far infrared ray transmitting filter described below are values measured by using NICOLET6700FT-IR (manufactured by Thermo Fisher Scientific Solutions LLC).

(1) An aspect in which a maximum value of a transmittance in a wavelength range of 1 to 3 µm is 0.001% to 30% (preferably 0.001% to 20% and more preferably 0.001% to 10%), and the minimum value of transmittance in the wavelength range of 8 to 10 µm is 40% to 99%.

(2) An aspect in which a maximum value of a transmittance in a wavelength range of 3 to 5 µm is 0.001% to 30% (preferably 0.001% to 20% and more preferably 0.001% to 10%), and the minimum value of transmittance in the wavelength range of 8 to 10 µm is 40% to 99%.

(3) An aspect in which a maximum value of a transmittance in a wavelength range of 8 to 10 µm is 0.001% to 30% (preferably 0.001% to 20% and more preferably 0.001% to 10%), and the minimum value of transmittance in the wavelength range of 12 to 14 µm is 40% to 99%.

(4) An aspect in which a maximum value of a transmittance in a wavelength range of 12 to 14 µm is 0.001% to 30% (preferably 0.001% to 20% and more preferably 0.001% to 10%), and the minimum value of transmittance in the wavelength range of 8 to 10 µm is 40% to 99%.

According to the aspect of (1), it is more preferable that the maximum value of the transmittance in the wavelength range of less than 1 µm is 0.001% to 30% (preferably 0.001% to 20% and more preferably 0.001% to 10%) and the minimum value of the transmittance in the wavelength range of greater than 10 µm and less than 14 µm or less is 40% to 99%. That is, according to the aspect of (1), it is more preferable that the maximum value of the transmittance in the wavelength range of 3 µm or less is 0.001% to 30% (preferably 0.001 to 20% and more preferably 0.001% to 10%), and the minimum value of the transmittance in the wavelength range of 8 to 14 µm is 40% to 99%.

According to the aspect of (2), it is more preferable that the maximum value of the transmittance in the wavelength range of 1 µm or more and less than 3 µm is 0.001% to 30% (preferably, 0.001% to 20% and more preferably 0.001% to 10%), and the minimum value of the transmittance of the wavelength range of greater than 10 µm and 14 µm or less is 40% to 99%. That is, according to the aspect of (2), it is more preferable that the maximum value of the transmittance in the wavelength range of 1 to 5 µm is 0.001% to 30% (preferably 0.001 to 20% and more preferably 0.001% to 10%), and the minimum value of the transmittance of the wavelength range of 8 to 14 µm is 40% to 99%.

According to the aspect of (3), it is more preferable that the maximum value of the transmittance in the wavelength range of 7 µm or more and less than 8 µm is 0.001% to 30% (preferably 0.001% to 20% and more preferably 0.001% to 10%), and the minimum value of the transmittance in the wavelength range of greater than 14 µm and 15 µm or less is 40% to 99%. That is, according to the aspect of (3), it is more preferable that the maximum value of the transmittance of the wavelength range of 7 to 10 µm is 0.001% to 30% (preferably 0.001% to 20% and more preferably 0.001% to 10%), and the minimum value of the transmittance of the wavelength range of 12 to 15 µm is 40% to 99%.

The formed body and the far infrared ray transmitting filter having the spectral properties of (1) can be formed by using the composition in which a ratio $A_{min}/B_{max}$ between the minimum value $A_{min}$ of the absorbance in the wavelength range of 1 to 3 µm and the maximum value $B_{max}$ of the absorbance in the wavelength range of 8 to 10 µm is 3 or more.

The formed body and the far infrared ray transmitting filter having the spectral properties of (2) can be formed by using the composition in which a ratio $A_{min}/B_{max}$ between the minimum value $A_{min}$ of the absorbance in the wavelength range of 3 to 5 µm and the maximum value $B_{max}$ of the absorbance in the wavelength range of 8 to 10 µm is 3 or more.

The formed body and the far infrared ray transmitting filter having the spectral properties of (3) can be formed by using the composition in which a ratio $A_{min}/B_{max}$ between the minimum value $A_{min}$ of the absorbance in the wavelength range of 8 to 10 µm and the maximum value $B_{max}$ of the absorbance in the wavelength range of 12 to 14 µm is 3 or more.

The formed body and the far infrared ray transmitting filter having the spectral properties of (4) can be formed by using the composition in which a ratio $A_{min}/B_{max}$ between the minimum value $A_{min}$ of the absorbance in the wavelength range of 12 to 14 µm and the maximum value $B_{max}$ of the absorbance in the wavelength range of 8 to 10 µm is 3 or more.

The film-shaped formed body can be manufactured by a step of applying the composition according to the embodiment of the present invention to a substrate so as to form a composition layer. If necessary, the step of drying the composition layer, the step of curing the composition layer, the step of forming a pattern on the composition layer, and the like may be performed. According to the present invention, it is preferable to have at least one of the step of drying the composition layer or the step of curing the composition layer. The formed body may be used by being peeled off from the substrate or may be used in the state of being laminated on the substrate.

In the step of forming of the composition layer, as a method of applying the composition to the substrate, well-known methods can be used. Examples thereof include a dropwise adding method (drop cast); a slit coating method; a spray method; a roll coating method; a spin coating method (spin coating); a casting coating method; a slit and spin method; a pre-wet method (for example, a method disclosed in JP2009-145395A); various printing methods such as inkjet (for example, an on-demand method, a piezo method, and a thermal method), ejection system printing such as nozzle jet, flexo printing, screen printing, gravure printing, inverse offset printing, and a metal mask printing method; a transfer method using a die or the like; and a nanoimprint method. The application method by inkjet is not particularly limited, and examples thereof include methods disclosed in "Spreading and usable inkjet—infinite possibilities in patent, issued in February 2005, S.B. Research Co., Ltd." (particularly, pages 115 to 133), JP2003-262716A, JP2003-185831A, JP2003-261827A, JP2012-126830A, and JP2006-169325A.

In the step of drying the composition layer, the drying condition can be appropriately adjusted depending on the type and content of the solvent included in the composition layer. For example, the temperature of 60° C. to 150° C. and 30 seconds to 15 minutes are preferable.

In the step of curing the composition layer, the curing treatment method is not particularly limited, and can be appropriately selected depending on the purpose. For example, an exposure treatment and a heat treatment are appropriately exemplified.

As the radiation (light) that can be used for the exposure treatment, ultraviolet rays such as g rays and i rays are preferably used (particularly preferably i rays). The irradiation amount (exposure amount) is, for example, preferably 0.03 to 2.5 $J/cm^2$ and more preferably 0.05 to 1.0 $J/cm^2$. The oxygen concentration in a case of exposure can be appropriately selected. In addition to performing the exposure in the atmosphere, exposure is performed under a low oxygen atmosphere (for example, preferably 15 vol % or less, more preferably 5 vol % or less, and even more preferably oxygen free) having an oxygen concentration of 19 vol % or less, or exposure may be performed under a high oxygen atmosphere (for example, preferably 22 vol % or more, more preferably 30 vol % or more, and even more preferably 50 vol % or more) in which the oxygen concentration exceeds 21 vol %. The exposure illuminance can be appropriately set, and can be selected in the range of 1,000 $W/m^2$ to 100,000 $W/m^2$ (for example, preferably 5,000 $W/m^2$ or more, more preferably 15,000 $W/m^2$ or more, and even more preferably 35,000 $W/m^2$). The conditions of the oxygen concentration and the expose illuminance can be appropriately combined, and examples thereof include the oxygen concentration of 10 vol % and the illuminance of 10,000 $W/m^2$ or the oxygen concentration of 35 vol % and the illuminance of 20,000 $W/m^2$.

The heating temperature in the heat treatment is preferably 100° C. to 260° C. The lower limit is preferably 120° C. or more and more preferably 160° C. or more. The upper limit is preferably 240° C. or less and more preferably 220° C. or less. The heating time is preferably 1 to 180 minutes. The lower limit is preferably 3 minutes or more. The upper limit is preferably 120 minutes or less. The heating device is not particularly limited, and can be appropriately selected depending on the purpose. Among the well-known devices, examples thereof include a dry oven, a hot plate, and an infrared heater.

In the step of forming the pattern, a pattern may be formed in the composition layer by photolithography, or a pattern may be formed in the composition layer by a dry etching method.

In a case where a pattern is formed on the composition layer by photolithography, examples thereof include a method of a step of applying the composition according to the embodiment of the present invention to the substrate to form a composition layer, a step of exposing the composition layer in a pattern form, and a step of developing and removing the unexposed portion of the composition layer to form a pattern. In a case of the pattern forming by using photolithography, it is preferable that the composition preferably includes a polymerizable compound, a photopolymerization initiator, and an alkali-soluble resin.

The step of forming the composition layer can be performed by using the above method.

Examples of the step of exposing the composition layer in a pattern shape include a method of exposing the composition layer on the substrate by using an exposure device such as a stepper via a mask having a predetermined mask pattern. Accordingly, the exposed portion can be cured.

In the step of developing and removing the unexposed portion, developing and removing the unexposed portion can be performed by using a developer. As a result, the composition layer in the unexposed portion is eluted into the developer, and only the photocured portion remains. As a developer, an alkali developer which does not cause damage to the underlying circuit and the like is desirable. For example, the temperature of the developer is preferably 20° C. to 30° C. The development time is preferably 20 to 180 seconds and more preferably 20 to 90 seconds.

As the alkali developer, an alkaline aqueous solution obtained by diluting an alkali agent with pure water is preferably used. Examples of the alkali agent include an organic alkali compound such as ammonia water, ethylamine, diethylamine, dimethylethanolamine, diglycol amine, diethanolamine, hydroxylamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis (2-hydroxyethyl) ammonium hydroxide, colin, pyrrole, piperidine, and 1,8-diazabicyclo [5.4.0]-7-undecene, and an inorganic alkali compound such as sodium hydroxide, potassium hydroxide, sodium carbonate, sodium hydrogen carbonate, sodium silicate, and sodium metasilicate. The concentration of the alkali agent in the alkaline aqueous solution is preferably 0.001 to 10 mass % and more preferably 0.01 to 1 mass %. The pH of the alkali developer is preferably 10.0 to 14.0. The alkali developer may further contain a surfactant. Examples of the surfactant include the surfactants described in the aforementioned composition, and a nonionic surfactant is preferable. In a case where an alkali developer including the alkaline aqueous solution is used, it is preferable to perform a rinse with pure water after development.

After the development, heating or exposure may be further performed. According to this aspect, the curing of the film further proceeds, and a more firmly cured film can be manufactured.

The flat sheet-shaped or lens-shaped formed body including the composition according to the embodiment of the present invention can be manufactured by using a well-known method of manufacturing ceramic. Specific examples thereof include a die press forming method, a rubber pressing method, an injection molding method, a slip casting method, and an extrusion forming method. Forming conditions can be appropriately adjusted depending on the application.

The formed body according to the embodiment of the present invention can be preferably used as a formed body for a far infrared ray transmitting filter. Specifically, the formed body can be preferably used for a far infrared transmission filter used for inspection equipment and a sensor using far infrared rays, a far infrared transmission filter used for a sensor using far infrared rays such as a current collecting sensor, and a substrate material for measuring far infrared ray transmittance. The formed body can be incorporated into an infrared camera, a solid-state imaging element, an infrared sensor, and the like to be used.

<Laminate>

Subsequently, the laminate according to the embodiment of the present invention is described. The laminate according to the embodiment of the present invention has the formed body according to the embodiment of the present invention described above on the substrate.

The substrate used for the laminate is preferably a Ge substrate, a Si substrate, a ZnSe substrate, a ZnS substrate, a $CaF_2$ substrate, an ITO substrate, an $Al_2O_3$ substrate, a $BaF_2$ substrate, a chalcogenide glass substrate, a diamond substrate, a quartz substrate, a $MgF_2$ substrate, and a LiF substrate, more preferably a Ge substrate, a Si substrate, a chalcogenide glass substrate, a ZnS substrate, and a ZnSe substrate, and even more preferably a Ge substrate. By using the substrate, a laminate having excellent far infrared ray transmitting performance is easily obtained. A functional layer such as an antireflection layer, a hard coat layer, or a barrier layer may be formed on the substrate in the used for the laminate.

With respect to the laminate according to the embodiment of the present invention, a refractive index n1 of the formed body at a wavelength of 10 μm and a refractive index n2 of the layer (hereinafter, also referred to as another layer) that is in contact with the formed body in a thickness direction of the formed body at a wavelength of 10 μm preferably satisfies the following relationship.

$$(n2)^{0.5}-1 \leq n1 \leq (n2)^{0.5}+1$$

The refractive index n1 and the refractive index n2 more preferably satisfy the following relationship.

$$(n2)^{0.5}-0.5 \leq n1 \leq (n2)^{+0.5}+0.5$$

The refractive index n1 and the refractive index n2 even more preferably satisfy the following relationship.

$$(n2)^{0.5}-0.1 \leq n1 \leq (n2)^{0.5}+0.1$$

In a case where the refractive index n1 and the refractive index n2 satisfy the following relationship, it is possible to obtain a laminate having excellent far infrared ray transmitting performance and excellent antireflection performance.

In a case where the formed body according to the embodiment of the present invention is directly laminated on the substrate on which a functional layer is not formed, the substrate corresponds to another layer. In a case where the formed body according to the embodiment of the present invention is laminated on the substrate on which a functional layer is formed (that is, the functional layer is interposed between the substrate and the formed body according to the embodiment of the present invention), the functional layer (the functional layer immediately below the formed body according to the embodiment of the present invention) that is in contact with the formed body according to the embodiment of the present invention corresponds to another layer.

With respect to the laminate according to the embodiment of the present invention, a product of the refractive index n1 at a wavelength of 10 μm and a thickness T (the unit is μm) of the formed body preferably satisfies the following relationship.

$$1.5 < T \cdot n1 < 3.5$$

The product of the refractive index n1 and the thickness T of the formed body more preferably satisfies the following relationship.

$$2.0 < T \cdot n1 < 3.0$$

The product of the refractive index n1 and the thickness T of the formed body even more preferably satisfies the following relationship.

$$2.2 < T \cdot n1 < 2.7$$

In a case where the product of the refractive index n1 and the thickness T of the formed body satisfies the above relationship, a laminate having excellent far infrared ray transmitting performance and excellent antireflection performance can be obtained.

The laminate according to the embodiment of the present invention can be preferably used in the far infrared ray transmitting filter or the like that selectively transmits light in a specific wavelength in the wavelength range of 1 to 14 μm.

<Far Infrared Ray Transmitting Filter>

The far infrared ray transmitting filter according to the embodiment of the present invention has the formed body according to the embodiment of the present invention or the laminate according to the embodiment of the present invention.

The far infrared ray transmitting filter according to the embodiment of the present invention preferably has an average refractive index in the wavelength range of 8 to 14 μm is 1.3 to 5.0. The lower limit is preferably 1.35 or more and more preferably 1.4 or more. The upper limit is preferably 4.5 or less and more preferably 4.0 or less.

The far infrared ray transmitting filter according to the embodiment of the present invention is preferably a refractive index of 1.3 to 5.0 at a wavelength of 10 μm. The lower limit is preferably 1.35 or more and more preferably 1.4 or more. The upper limit is preferably 4.5 or less and more preferably 4.0 or less.

The far infrared ray transmitting filter according to the embodiment of the present invention preferably has a refractive index of 1.3 to 5.0 in all the wavelength range of 8 to 14 μm. The lower limit is preferably 1.35 or more and more preferably 1.4 or more. The upper limit is preferably 4.5 or less and more preferably 4.0 or less.

The far infrared ray transmitting filter according to the embodiment of the present invention preferably has spectral properties of any one of (1) to (4) described in the aforementioned formed body.

The far infrared ray transmitting filter according to the embodiment of the present invention can be preferably used for inspection equipment and a sensor using far infrared rays. Examples thereof include a gas detection sensor, a human body detection sensor, a non-destructive inspection sensor, a distance measuring sensor, a biometric sensor, a motion capture sensor, a temperature measurement sensor, a component analysis sensor, and a vehicle sensor.

<Solid-State Imaging Element, Infrared Camera, and Infrared Sensor>

The solid-state imaging element according to the embodiment of the present invention has a far infrared ray transmitting filter according to the embodiment of the present invention. The infrared camera according to the embodiment of the present invention has the far infrared ray transmitting filter according to the embodiment of the present invention. The infrared sensor according to the embodiment of the present invention has the far infrared ray transmitting filter according to the embodiment of the present invention. Examples of the kinds of the infrared sensor include a gas detection sensor, a human body detection sensor, a non-destructive inspection sensor, a distance measuring sensor, a biometric sensor, a motion capture sensor, a temperature measurement sensor, a component analysis sensor, a vehicle sensor, a blood glucose level sensor, a health care sensor, and a medical sensor. The configuration of the solid-state imaging element, the infrared camera, and the infrared sensor has the configuration of the far infrared ray transmitting filter according to the embodiment of the present invention, and the configuration is not particularly limited, as long as the configuration functions as a solid-state imaging element, an infrared camera, and an infrared sensor.

EXAMPLES

Hereinafter, the present invention is specifically described with reference to the examples. A material, an amount used, a treatment detail, a treatment order, and the like provided in the following examples can be suitably changed without departing from the gist of the present invention. Accordingly, the range of the present invention is not limited to the specific examples described below. Unless described otherwise, "%" and "parts" are based on mass.

<Method of Measuring Acid Value>

The measurement sample was dissolved in a mixed solvent of tetrahydrofuran/water=9/1 (mass ratio) to prepare a measurement solution. The obtained measurement solution was subjected to neutralization titration with a 0.1 mol/L sodium hydroxide aqueous solution at 25° C. with a potentiometric titrator (trademark: AT-510, manufactured by Kyoto Electronics Manufacturing Co., Ltd.). An acid value was calculated by using an inflection point of a titration pH curve as a titration end point by the following equation.

$$A = 56.11 \times Vs \times 0.5\, f/w$$

A: Acid value (mgKOH/g)

Vs: Used amount of 0.1 mol/L sodium hydroxide aqueous solution used for titration (mL)

f: Titer of 0.1 mol/L sodium hydroxide aqueous solution w: Mass (g) of measurement sample (expressed in terms of solid content)

<Method of Measuring Weight-Average Molecular Weight>

In the measuring of the weight-average molecular weight, HPC-8220GPC (manufactured by Tosoh Corporation) was used as a measuring device, TSK guard column Super HZ-L was used as a guard column, a column obtained by connecting TSKgel Super HZM-M, TSKgel Super HZ4000, TSKgel Super HZ3000, and TSKgel Super HZ2000 was used as a column, a column temperature was set as 40° C., 10 μL of a tetrahydrofuran solution having a sample concentration of 0.1 mass % was injected, tetrahydrofuran was flowed at a flow rate of 0.35 mL/min as an elution solvent, a sample peak was detected with a differential refractive index (RI) detector, and a calibration curve manufactured by using standard polystyrene was used for calculation, so as to calculate the weight-average molecular weight.

Test Example 1

<Preparation of Dispersion Liquid 1>

Dispersion Liquid 1 was obtained by performing a dispersion treatment on a mixed liquid having the following composition by using ULTRA APEX MILL manufactured by Hiroshima Metal & Machinery Co. Ltd. as a recycling dispersion apparatus (beads mill).

| (Composition of mixed liquid) | |
|---|---|
| Rh₂O₃ particles (average primary particle diameter: 50 nm) | 18 parts by mass |
| Resin A | 6.7 parts by mass |
| Cyclohexanone | 75.3 parts by mass |

Resin A: 30 mass % propylene glycol methyl ether acetate solution of a resin of the following structure (in the formula, n was 14, the weight-average molecular weight was 6,400, and the acid value was 80 mgKOH/g. The resin A was synthesized in conformity with a synthesis method disclosed in paragraphs 0114 to 0140 and 0266 to 0348 of JP2007-277514A.)

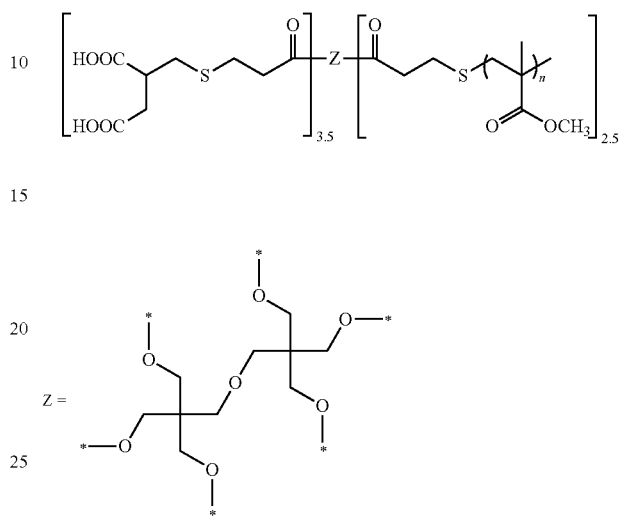

The dispersing device was operated under the following conditions.

Bead diameter: diameter of 0.05 mm

Bead filling rate: 75 vol %

Circumferential speed: 10 m/s

Supply amount of pump: 10 kg/hour

Cooling water: Tap water

Inner volume of beads mill cyclic passage: 0.15 L

Amount of mixed liquid subjected to dispersion treatment: 0.7 kg

<Preparation of Dispersion Liquid 2>

Dispersion Liquid 2 was prepared in the same manner as Dispersion Liquid 1 except that the following mixed liquid was used.

| (Composition of mixed liquid) | |
|---|---|
| Rh₂O₃ particles (average primary particle diameter: 50 nm) | 18 parts by mass |
| Resin B | 6.7 parts by mass |
| Propylene glycol methyl ether acetate (PGMEA) | 75.3 parts by mass |

Resin B: A 30 mass % propylene glycol methyl ether acetate solution of a resin (weight-average molecular weight: 24,000, acid value 53 mgKOH/g, a numerical value appended to a repeating unit is a molar ratio, and a numerical value appended to a side chain is the number of repeating units) having the following structure.

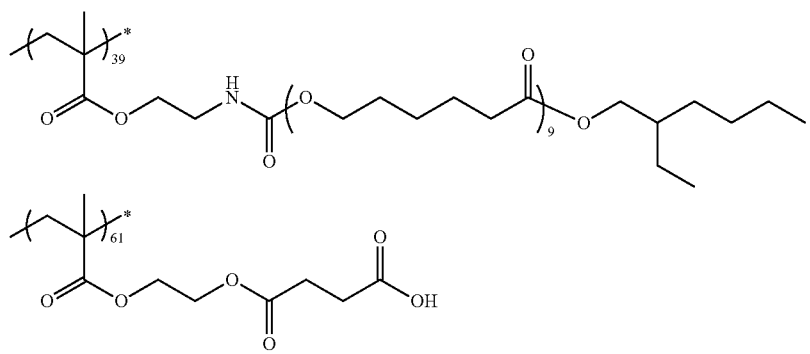

<Preparation of Dispersion Liquids 3 to 25>

Dispersion liquids were prepared in the same manner as Dispersion Liquid 1 except that kinds of metal particles and resins were changed as below.

TABLE 1

| Dispersion Liquid | Metal particle Kind | Average primary particle diameter (nm) | Resin |
|---|---|---|---|
| 3 | $Rh_2O_3$ | 50 | Resin C |
| 4 | $Rh_2O_3$ | 50 | Resin D |
| 5 | $Rh_2O_3$ | 50 | Resin E |
| 6 | $Rh_2O_3$ | 50 | Resin F |
| 7 | $Rh_2O_3$ | 50 | Resin A/Resin B = 1/1 (mass ratio) |
| 8 | $Ag_2S$ | 70 | Resin C |
| 9 | $FeSi_2$ | 50 | Resin C |
| 10 | CoO | 50 | Resin C |
| 11 | $Mg_2Si$ | 50 | Resin C |
| 12 | MnSi | 50 | Resin C |
| 13 | $MnO_2$ | 50 | Resin C |
| 14 | $BaSi_2$ | 50 | Resin C |
| 15 | $V2O_3$ | 50 | Resin C |
| 16 | $MnO_2$ | 50 | Resin C |
| 17 | PbS | 50 | Resin C |
| 18 | $Ag_2Te$ | 70 | Resin C |
| 19 | $Ti_2O_3$ | 50 | Resin C |
| 20 | $SrZrO_3$ | 50 | Resin C |
| 21 | $BaZrO_3$ | 50 | Resin C |
| 22 | $Ta_2O_5$ | 50 | Resin C |
| 23 | $WO_3$ | 50 | Resin C |
| 24 | $CrF_3$ | 50 | Resin C |
| 25 | $BiF_3$ | 50 | Resin C |
| 26 | $Li_2ZrO_3$ | 50 | Resin C |
| 27 | $CaZrO_3$ | 50 | Resin C |
| 28 | $CuTiO_3$ | 50 | Resin C |
| 29 | $ZnTiO_3$ | 50 | Resin C |
| 30 | $Ce(TiO_3)_2$ | 50 | Resin C |
| 31 | $Bi(TiO_3)_3$ | 50 | Resin C |
| 32 | $CaTiO_3$ | 50 | Resin C |
| 33 | $BaTiO_3$ | 50 | Resin C |
| 34 | Mixed crystal of $BaSi_2$ and $BaZrO_3$ | 50 | Resin C |
| 35 | Mixed crystal of $Ag_2S$ and $Ag_2Te$ | 50 | Resin C |
| 36 | Mixed crystal of CoO and $MnO_2$ | 50 | Resin C |
| 37 | Mixed crystal of $Ti_2O_3$ and $V_2O_3$ | 50 | Resin C |
| 38 | Mixed crystal of $Mg_2Si$ and $BaSi_2$ | 51 | Resin C |
| 39 | $CsWO_5$ | 52 | Resin C |

As Resin C, DISPERBYK 103 (manufactured by BYK Chemie GmbH) was used.

As Resin D, a 30 mass % propylene glycol methyl ether acetate solution of a resin having the following structure was used. The weight-average molecular weight of a resin having the following structure was 23000. A numerical value appended to the repeating unit is a molar ratio, and a numerical value appended to a side chain is the number of repeating units.

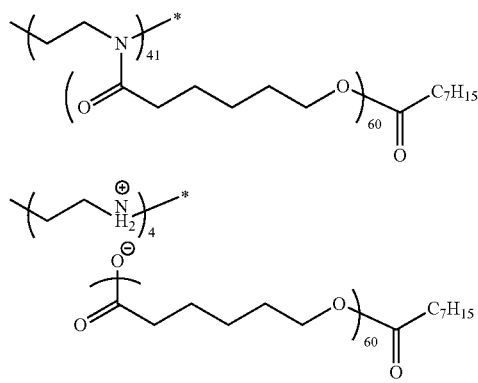

-continued

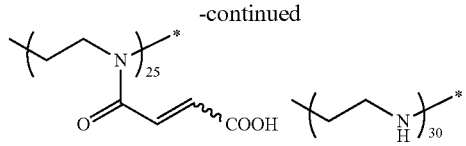

As Resin E, DISPERBYK 111 (manufactured by BYK Chemie GmbH) was used.

As Resin F, a 44 mass % propylene glycol methyl ether acetate solution of a resin having the following structure was used. The weight-average molecular weight of a resin having the following structure was 40,000. A numerical value appended to the repeating unit was a molar ratio.

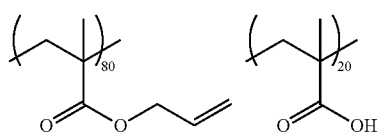

Preparing of Composition

Example 1

The following components were mixed so as to prepare a composition of Example 1.

| | |
|---|---|
| Dispersion Liquid 1 | 50 parts by mass |
| Alkali-soluble Resin 1 (44 mass % propylene glycol methyl ether acetate solution of resin having the following structure. The weight-average molecular weight of a resin having the following structure was 5000. A numerical value appended to the repeating unit was a molar ratio.) | 11 parts by mass |

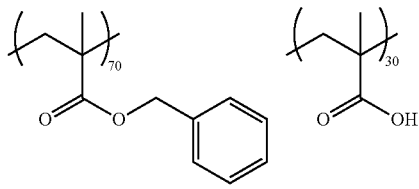

| | |
|---|---|
| Polymerizable compound (ARONIX M-510, manufactured by Toagosei Co., Ltd.) | 3 parts by mass |
| Photopolymerization initiator (IRGACURE-OXE01, manufactured by BASF SE) | 1 part by mass |
| Surfactant (Mixed product below, weight-average molecular weight = 14,000, % indicating proportion of repeating unit was mass %) | 0.04 parts by mass |

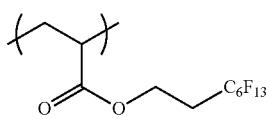

62%

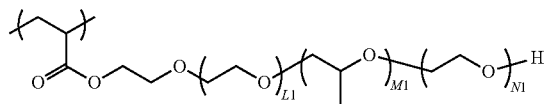

-continued

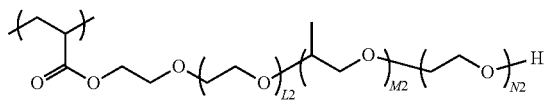

38%

L1 + N1 + L2 + N2 = 14
M1 + M2 = 17

| | |
|---|---|
| Polymerization inhibitor (p-methoxy phenol) | 0.005 parts by mass |
| Ultraviolet absorbing agent (UV-503, manufactured by Daito Chemical Co., Ltd.) | 0.4 parts by mass |
| Silane coupling agent (KBM-502, manufactured by Shin-Etsu Chemical Co., Ltd.) | 0.2 parts by mass |
| PGMEA | 34.6 parts by mass |

Examples 2 to 38

The compositions were prepared in the same manner as in Example 1 except that Dispersion Liquid 1 was changed to Dispersion Liquids 2 to 38 in Example 1.

Example 39

The composition was prepared in the same manner as in Example 1 except that 25 parts by mass of Dispersion Liquid 1 and 25 parts by mass of Dispersion Liquid 2 were used instead of 50 parts by mass of Dispersion Liquid 1 in Example 1.

Example 40

The composition was prepared in the same manner as in Example 1 except that 5.5 parts by mass of Alkali-soluble Resin 1 and 5.5 parts by mass of Resin F were used instead of 11 parts by mass of Alkali-soluble Resin 1 in Example 1.

Example 41

The composition was prepared in the same manner as in Example 1 except that 1.5 parts by mass of ARONIX M-510 (manufactured by Toagosei Co., Ltd.) and 1.5 parts by mass of KAYARAD DPHA (manufactured by Nippon Kayaku Co., Ltd.) were used in combination as the polymerizable compound in Example 1.

Example 42

The composition was prepared in the same manner as in Example 1 except that 0.34 parts by mass of IRGACURE-OXE01 (manufactured by BASF SE), 0.33 parts by mass of IRGACURE-OXE03 (manufactured by BASF SE), and 0.33 parts by mass of IRGACURE-369 (manufactured by BASF SE) were used in combination as the photopolymerization initiator in Example 1.

Example 43

The composition was prepared in the same manner as in Example 1 except that 5.5 parts by mass of Alkali-soluble Resin 1 and 5.5 parts by mass of Resin F were used instead of 11 parts by mass of Alkali-soluble Resin 1 in Example 1.

Comparative Example 1

The compositions were prepared in the same manner as in Example 1 except that Dispersion Liquid 1 was changed to Dispersion Liquids 39 in Example 1.

<Evaluation of Spectral Properties>

Each composition was spin-coated on a Si wafer such that the film thickness after the heat treatment became 1.35 μm and was dried at 100° C. for 120 seconds by using a hot plate, then a heat treatment was performed at 200° C. for 300 seconds as to prepare a formed body. The absorbance of a Si wafer having the formed body in a wavelength of 1 to 14 μm is measured with NICOLET6700FT-IR (manufactured by Thermo Fisher Scientific Solutions LLC). As a reference, a Si wafer was used. The minimum value $A_{min}$ of the absorbance in the wavelength range in the section of the wavelength band A and the maximum value $B_{max}$ of the absorbance in the wavelength range in the section of the wavelength band B in the table below were measured so as to calculate the absorbance ratio ($A_{min}/B_{max}$). The maximum value $T_A$ of the transmittance in the wavelength band A of the formed body and the minimum value $T_B$ of the transmittance in the wavelength band B were measured, respectively.

<Measuring of Refractive Index of Formed Body>

The composition to be measured was coated on a Si wafer and heat-treated at 200° C. for 5 minutes to form a formed body so as to prepare a measurement sample. With respect to the manufactured measurement sample, the refractive index at a wavelength of 1.7 to 30 μm was measured with IR-VASE manufactured by J. A. Woollam Co., and the average refractive index at a wavelength of 8 to 14 μm was measured.

TABLE 2

| | Kind of dispersion liquid | Kind of metal particle | Wavelength band A | Wavelength band B | Absorbance ratio $A_{min}/B_{max}$ | $T_A$ (%) | $T_B$ (%) | Average refractive index |
|---|---|---|---|---|---|---|---|---|
| Example 1 | Dispersion Liquid 1 | $Rh_2O_3$ | 1 to 3 μm | 8 to 10 μm | 5.5 | 8 | 63 | 1.8 |
| Example 2 | Dispersion Liquid 2 | $Rh_2O_3$ | 1 to 3 μm | 8 to 10 μm | 5.3 | 8 | 62 | 1.7 |
| Example 3 | Dispersion Liquid 3 | $Rh_2O_3$ | 1 to 3 μm | 8 to 10 μm | 5.5 | 8 | 63 | 1.7 |

TABLE 2-continued

| | Kind of dispersion liquid | Kind of metal particle | Wavelength band A | Wavelength band B | Absorbance ratio $A_{min}/B_{max}$ | $T_A$ (%) | $T_B$ (%) | Average refractive index |
|---|---|---|---|---|---|---|---|---|
| Example 4 | Dispersion Liquid 4 | $Rh_2O_3$ | 1 to 3 μm | 8 to 10 μm | 5.5 | 8 | 63 | 1.7 |
| Example 5 | Dispersion Liquid 5 | $Rh_2O_3$ | 1 to 3 μm | 8 to 10 μm | 5.3 | 8 | 62 | 1.8 |
| Example 6 | Dispersion Liquid 6 | $Rh_2O_3$ | 1 to 3 μm | 8 to 10 μm | 4.2 | 8 | 55 | 1.8 |
| Example 7 | Dispersion Liquid 7 | $Rh_2O_3$ | 1 to 3 μm | 8 to 10 μm | 4.7 | 7 | 57 | 1.9 |
| Example 8 | Dispersion Liquid 8 | $Ag_2S$ | 1 to 3 μm | 8 to 10 μm | 4.9 | 6 | 56 | 1.4 |
| Example 9 | Dispersion Liquid 9 | $FeSi_2$ | 1 to 3 μm | 8 to 10 μm | 4.2 | 8 | 55 | 1.7 |
| Example 10 | Dispersion Liquid 10 | CoO | 8 to 10 μm | 12 to 14 μm | 4.0 | 9 | 55 | 1.7 |
| Example 11 | Dispersion Liquid 11 | $Mg_2Si$ | 1 to 3 μm | 8 to 10 μm | 4.6 | 8 | 58 | 1.7 |
| Example 12 | Dispersion Liquid 12 | MnSi | 1 to 3 μm | 8 to 10 μm | 5.1 | 8 | 61 | 1.7 |
| Example 13 | Dispersion Liquid 13 | $MnO_2$ | 1 to 3 μm | 8 to 10 μm | 5.2 | 9 | 63 | 1.7 |
| Example 14 | Dispersion Liquid 14 | $BaSi_2$ | 3 to 5 μm | 8 to 10 μm | 5.0 | 9 | 62 | 1.7 |
| Example 15 | Dispersion Liquid 15 | $V_2O_3$ | 3 to 5 μm | 8 to 10 μm | 5.1 | 8 | 61 | 1.7 |
| Example 16 | Dispersion Liquid 16 | $MnO_2$ | 1 to 3 μm | 8 to 10 μm | 4.6 | 8 | 58 | 1.7 |
| Example 17 | Dispersion Liquid 17 | PbS | 3 to 5 μm | 8 to 10 μm | 4.5 | 8 | 57 | 1.8 |
| Example 18 | Dispersion Liquid 18 | $Ag_2Te$ | 1 to 3 μm | 8 to 10 μm | 4.4 | 8 | 56 | 1.6 |
| Example 19 | Dispersion Liquid 19 | $Ti_2O_3$ | 8 to 10 μm | 12 to 14 μm | 4.5 | 8 | 57 | 1.6 |
| Example 20 | Dispersion Liquid 20 | $SrZrO_3$ | 12 to 14 μm | 8 to 10 μm | 5.0 | 7 | 59 | 1.7 |
| Example 21 | Dispersion Liquid 21 | $BaZrO_3$ | 12 to 14 μm | 8 to 10 μm | 4.2 | 7 | 53 | 1.7 |
| Example 22 | Dispersion Liquid 22 | $Ta_2O_5$ | 12 to 14 μm | 8 to 10 μm | 6.1 | 5 | 61 | 17 |
| Example 23 | Dispersion Liquid 23 | $WO_3$ | 12 to 14 μm | 8 to 10 μm | 11.7 | 4 | 76 | 1.7 |
| Example 24 | Dispersion Liquid 24 | $CrF_3$ | 1 to 3 μm | 8 to 10 μm | 4.7 | 6 | 55 | 1.5 |
| Example 25 | Dispersion Liquid 25 | $BiF_3$ | 1 to 3 μm | 8 to 10 μm | 5.3 | 6 | 59 | 1.5 |
| Example 26 | Dispersion Liquid 26 | $Li_2ZrO_3$ | 1 to 3 μm | 8 to 10 μm | 4.2 | 7 | 53 | 1.8 |
| Example 27 | Dispersion Liquid 27 | $CaZrO_3$ | 1 to 3 μm | 8 to 10 μm | 5.6 | 7 | 62 | 1.8 |
| Example 28 | Dispersion Liquid 28 | $CuTiO_3$ | 1 to 3 μm | 8 to 10 μm | 6.7 | 5 | 64 | 1.8 |
| Example 29 | Dispersion Liquid 29 | $ZnTiO_3$ | 1 to 3 μm | 8 to 10 μm | 5.0 | 5 | 55 | 1.8 |
| Example 30 | Dispersion Liquid 30 | $Ce(TiO_3)_2$ | 1 to 3 μm | 8 to 10 μm | 5.0 | 6 | 57 | 1.7 |
| Example 31 | Dispersion Liquid 31 | $Bi(TiO_3)_3$ | 1 to 3 μm | 8 to 10 μm | 5.7 | 5 | 59 | 1.8 |
| Example 32 | Dispersion Liquid 32 | $CaTiO_3$ | 1 to 3 μm | 8 to 10 μm | 5.7 | 6 | 61 | 1.8 |
| Example 33 | Dispersion Liquid 33 | $BaTiO_3$ | 1 to 3 μm | 8 to 10 μm | 5.7 | 6 | 61 | 1.8 |
| Example 34 | Dispersion Liquid 34 | Mixed crystal of $BaSi_2$ and $BaZrO_3$ | 3 to 5 μm | 8 to 10 μm | 6.4 | 7 | 66 | 1.8 |
| Example 35 | Dispersion Liquid 35 | Mixed crystal of $Ag_2S$ and $Ag_2Te$ | 3 to 5 μm | 8 to 10 μm | 6.3 | 8 | 67 | 1.8 |
| Example 36 | Dispersion Liquid 36 | Mixed crystal of CoO and $MnO_2$ | 3 to 5 μm | 8 to 10 μm | 6.9 | 7 | 68 | 1.8 |
| Example 37 | Dispersion Liquid 37 | Mixed crystal of $Ti_2O_3$ and $V_2O_3$ | 3 to 5 μm | 8 to 10 μm | 6.2 | 7 | 65 | 1.8 |
| Example 38 | Dispersion Liquid 38 | Mixed crystal of $Mg_2Si$ and $BaSi_2$ | 1 to 3 μm | 8 to 10 μm | 6.0 | 7 | 64 | 1.8 |
| Example 39 | Dispersion Liquids 1 and 2 | $Rh_2O_3$ | 1 to 3 μm | 8 to 10 μm | 5.6 | 7 | 62 | 1.8 |
| Example 40 | Dispersion Liquid 1 | $Rh_2O_3$ | 1 to 3 μm | 8 to 10 μm | 5.5 | 8 | 63 | 1.7 |
| Example 41 | Dispersion Liquid 1 | $Rh_2O_3$ | 1 to 3 μm | 8 to 10 μm | 5.3 | 8 | 62 | 1.8 |
| Example 42 | Dispersion Liquid 1 | $Rh_2O_3$ | 1 to 3 μm | 8 to 10 μm | 5.5 | 8 | 63 | 1.8 |
| Example 43 | Dispersion Liquid 1 | $Rh_2O_3$ | 1 to 3 μm | 8 to 10 μm | 5.5 | 8 | 63 | 1.8 |
| Comparative Example 1 | Dispersion Liquid 39 | $CsWO_3$ | 1 to 3 μm<br>8 to 10 μm | 8 to 10 μm<br>12 to 14 μm | 1.0<br>2.5 | 22<br>22 | 22<br>54 | 1.7<br>1.7 |

As shown in the above table, in the examples, it was possible to manufacture a formed body that selectively transmits light in the wavelength range of 1 to 14 μm. By incorporating this formed body in the infrared sensor, it is possible to achieve sensing with a good accurate.

Test Example 2

Example 101

The composition of Example 1 above was spin-coated on a Si wafer such that the film thickness after the heat treatment became 1.35 μm and dried at 100° C. for 120 seconds by using a hot plate, and then a heat treatment was further performed at 200° C. for 300 seconds, so as to manufacture a formed body. The refractive index of the formed body at a wavelength of 10 μm was 1.85 and the refractive index of the Si wafer at a wavelength of 10 μm was 3.42. With respect to the Si wafer on which the formed body was laminated, the transmittance of light at the wavelength 10 μm was measured by using NICOLET 6700 FT-IR (manufactured by Thermo Fisher Scientific Solutions LLC). The transmittance of the laminate including the Si wafer was measured by performing the reference measurement without the Si wafer.

Example 102

The composition of Example 2 above was spin-coated on a Ge wafer such that the film thickness after the heat treatment became 1.25 μm and dried at 100° C. for 120 seconds by using a hot plate, and then a heat treatment was further performed at 200° C. for 300 seconds, so as to manufacture a formed body. The refractive index of the formed body at a wavelength of 10 μm was 2.0 and the refractive index of the Ge wafer at the wavelength of 10 μm was 4.0. With respect to the Ge wafer on which the formed body was laminated, the transmittance of light at the wavelength 10 μm was measured by using NICOLET 6700 FT-IR (manufactured by Thermo Fisher Scientific Solutions LLC).

The transmittance of the laminate including the Ge substrate was measured by performing the reference measurement without the Ge substrate.

Comparative Example 101

The transmittance of the Si wafer of light at the wavelength 10 μm was measured by using NICOLET 6700 FT-IR (manufactured by Thermo Fisher Scientific Solutions LLC).

Comparative Example 102

The transmittance of the Ge wafer of light at the wavelength 10 μm was measured by using NICOLET 6700 FT-IR (manufactured by Thermo Fisher Scientific Solutions LLC). In the laminates of the examples, the transmittance in the wavelength 1 to 3 μm was 10%, and the transmittance in the wavelength of 8 to 10 μm was 60%, and light in the wavelength range of 8 to 10 μm was able to be selectively transmitted. The transmittances of the laminates of the examples of light at a wavelength of 10 μm were higher than those of comparative examples, and far infrared ray transmitting performance was excellent. In Comparative Example 101 (Si wafer) and Comparative Example 102 (Ge wafer), a ratio $A_{min}/B_{max}$ between the minimum value $A_{min}$ of the absorbance in the wavelength range of 1 to 3 μm and the maximum value $B_{max}$ of the absorbance in the wavelength range of 8 to 10 μm was less than 3.

Test Example 3

Example 201

A flat sheet-shaped formed body (thickness of 2 mm) was manufactured by performing injection molding on Dispersion Liquid 2. The refractive index of the formed body at a wavelength of 10 μm was 3.8, and the transmittance of the light having a wavelength of 10 μm was 60%. The transmittance at a wavelength of 1 to 3 μm was 10%, the transmittance at a wavelength of 8 to 10 μm was 60%, and light having a wavelength range of 8 to 10 μm was able to be selectively transmitted.

Example 202

A flat sheet-shaped formed body was prepared in the same manner as in Example 201 except that the liquid used was changed to the composition of Example 2. The refractive index of the formed body at a wavelength of 10 μm was 2.1, and the transmittance of the light having a wavelength of 10 μm was 70%. The transmittance at a wavelength of 1 to 3 μm was 10%, the transmittance at a wavelength of 8 to 10 μm was 60%, and light having a wavelength range of 8 to 10 μm was able to be selectively transmitted.

What is claimed is:

1. A composition comprising:
a metal particle; and
a resin,
wherein the metal particle includes at least one of $Rh_2O_3$ particles, $Ag_2S$ particles, $FeSi_2$ particles, CoO particles, $Mg_2Si$ particles, MnSi particles, $MnO_2$ particles, $BaSi_2$ particles, $V_2O_3$ particles, PbS particles, $Ag_2Te$ particles, $Ti_2O_3$ particles, $SrZrO_3$ particles, $BaZrO_3$ particles, $Ta_2O_5$ particles, $WO_3$ particles, $CrF_3$ particles, $BiF_3$ particles, $Li_2ZrO_3$ particles, $CaZrO_3$ particles, $CuTiO_3$ particles, $ZnTiO_3$ particles, $Ce(TiO_3)_2$ particles, $Bi(TiO_3)_3$ particles, $CaTiO_3$ particles, $BaTiO_3$ particles, particles including a mixed crystal of $Ag_2S$ and $Ag_2Te$, particles including a mixed crystal of CoO and $MnO_2$, particles including a mixed crystal of $Ti_2O_3$ and $V_2O_3$, or particles including a mixed crystal of $Mg_2Si$ and $BaSi_2$, and
wherein the composition, in a wavelength range of 1 to 14 μm, has a wavelength band A having a wavelength band width of 1 μm or more, and a wavelength band B having a lower absorbance than the wavelength band A and having a wavelength band width of 1 μm or more, and
a ratio $A_{min}/B_{max}$ between a minimum value $A_{min}$ of an absorbance of the wavelength band A and a maximum value $B_{max}$ of an absorbance of the wavelength band B is 3 or more.

2. The composition according to claim 1,
wherein the wavelength band B is on a longer wavelength side than the wavelength band A.

3. The composition according to claim 1,
wherein the wavelength band B is on a shorter wavelength side than the wavelength band A.

4. The composition according to claim 1,
wherein a band gap energy of the metal particle at 25° C. is 1.0 eV or less.

5. A formed body obtained by using the composition according to claim 1.

6. The formed body according to claim 5,
wherein an average refractive index is 1.3 to 5.0 in a wavelength range of 8 to 14 μm.

7. The formed body according to claim 5,
wherein a shape of the formed body is a film shape, a flat sheet shape, or a lens shape.

8. The formed body according to claim 5, which is used for a far infrared ray transmitting filter.

9. A laminate comprising:
a substrate; and
the formed body according to claim 5 provided on the substrate.

10. The laminate according to claim 9,
wherein a refractive index n1 of the formed body at a wavelength of 10 μm and a refractive index n2 of a layer that is in contact with the formed body in a thickness direction of the formed body at a wavelength of 10 μm satisfy the following relationship, $$(n2)^{0.5}-1 \leq n1 \leq (n2)^{0.5}+1.$$

11. A far infrared ray transmitting filter comprising:
the laminate according to claim 9.

12. A far infrared ray transmitting filter comprising:
the formed body according to claim 5.

13. A solid-state imaging element comprising:
the far infrared ray transmitting filter according to claim 12.

14. An infrared camera comprising:
the far infrared ray transmitting filter according to claim 12.

15. An infrared sensor comprising:
the far infrared ray transmitting filter according to claim 12.

16. The composition according to claim 1,
wherein the metal particle includes at least one of $Rh_2O_3$ particles, $Ag_2S$ particles, $FeSi_2$ particles, CoO particles, $Mg_2Si$ particles, MnSi particles, $MnO_2$ particles, $BaSi_2$ particles, $V_2O_3$ particles, PbS particles, $Ag_2Te$ particles, $SrZrO_3$ particles, $BaZrO_3$ particles, $Ta_2O_5$ particles, $WO_3$ particles, $CrF_3$ particles, $BiF_3$ particles, $Li_2ZrO_3$ particles, $CaZrO_3$ particles, $CuTiO_3$ particles, ZnTiO$_3$ particles, Ce(TiO$_3$)$_2$ particles, Bi(TiO$_3$)$_3$ particles, CaTiO$_3$ particles, BaTiO$_3$ particles, particles including a mixed crystal of Ag$_2$S and Ag$_2$Te, particles including a mixed crystal of CoO and MnO$_2$, particles including a mixed crystal of Ti$_2$O$_3$ and V$_2$O$_3$, or particles including a mixed crystal of Mg$_2$Si and BaSi$_2$.

17. The composition according to claim 1,
wherein the metal particle includes at least one of Rh$_2$O$_3$ particles, Ag$_2$S particles, FeSi$_2$ particles, CoO particles, Mg$_2$Si particles, MnSi particles, MnO$_2$ particles, BaSi$_2$ particles, V$_2$O$_3$ particles, PbS particles, Ag$_2$Te particles, SrZrO$_3$ particles, BaZrO$_3$ particles, Ta$_2$O$_5$ particles, CrF$_3$ particles, BiF$_3$ particles, Li$_2$ZrO$_3$ particles, CaZrO$_3$ particles, CuTiO$_3$ particles, ZnTiO$_3$ particles, Ce(TiO$_3$)$_2$ particles, Bi(TiO$_3$)$_3$ particles, CaTiO$_3$ particles, BaTiO$_3$ particles, particles including a mixed crystal of Ag$_2$S and Ag$_2$Te, particles including a mixed crystal of CoO and MnO$_2$, particles including a mixed crystal of Ti$_2$O$_3$ and V$_2$O$_3$, or particles including a mixed crystal of Mg$_2$Si and BaSi$_2$.

18. The composition according to claim 1,
wherein the metal particle includes at least one of Rh$_2$O$_3$ particles, Ag$_2$S particles, FeSi$_2$ particles, Mg$_2$Si particles, MnSi particles, MnO$_2$ particles, Ag$_2$Te particles, CrF$_3$ particles, BiF$_3$ particles, Li$_2$ZrO$_3$ particles, CaZrO$_3$ particles, CuTiO$_3$ particles, ZnTiO$_3$ particles, Ce(TiO$_3$)$_2$ particles, Bi(TiO$_3$)$_3$ particles, CaTiO$_3$ particles, BaTiO$_3$ particles, or particles including a mixed crystal of Mg$_2$Si and BaSi$_2$.

19. The composition according to claim 1,
wherein the metal particle includes at least one of BaSi$_2$ particles, V$_2$O$_3$ particles, PbS particles, particles including a mixed crystal of Ag$_2$S and Ag$_2$Te, particles including a mixed crystal of CoO and MnO$_2$, particles including a mixed crystal of Ti$_2$O$_3$ and V$_2$O$_3$, and particles including a mixed crystal of BaSi$_2$ and BaZrO$_3$.

20. The composition according to claim 1,
wherein the metal particle includes Rh atom.

21. A composition comprising:
a metal particle; and
a resin,
wherein the composition, in a wavelength range of 1 to 14 µm, has a wavelength band A having a wavelength band width of 1 µm or more, and a wavelength band B having a lower absorbance than the wavelength band A and having a wavelength band width of 1 µm or more,
a ratio $A_{min}/B_{max}$ between a minimum value $A_{min}$ of an absorbance of the wavelength band A and a maximum value $B_{max}$ of an absorbance of the wavelength band B is 3 or more, and
the wavelength band B is on a shorter wavelength side than the wavelength band A.

\* \* \* \* \*